United States Patent
Cheng et al.

(10) Patent No.: US 7,294,543 B2
(45) Date of Patent: Nov. 13, 2007

(54) DRAM (DYNAMIC RANDOM ACCESS MEMORY) CELLS

(75) Inventors: Kangguo Cheng, Beacon, NY (US); Babar Ali Khan, Ossining, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 11/308,404

(22) Filed: Mar. 22, 2006

(65) Prior Publication Data

US 2007/0222020 A1    Sep. 27, 2007

(51) Int. Cl.
*H01L 21/8242* (2006.01)

(52) U.S. Cl. .............. 438/243; 438/246; 438/249; 438/392; 257/301; 257/E21.396

(58) Field of Classification Search ........... 257/296, 257/301–305, E29.346, E21.396; 438/243–249, 438/386, 389–392
See application file for complete search history.

(56) References Cited

U.S. PATENT DOCUMENTS

| | | | |
|---|---|---|---|
| 4,761,385 A | 8/1988 | Pfiester | |
| 5,498,564 A | 3/1996 | Geissler et al. | |
| 5,998,822 A | 12/1999 | Wada | |
| 6,163,045 A | 12/2000 | Mandelman et al. | |
| 6,246,175 B1* | 6/2001 | Kou et al. | 315/111.21 |
| 6,249,017 B1 | 6/2001 | Togo | 257/301 |
| 6,265,279 B1 | 7/2001 | Radens et al. | 438/386 |
| 6,297,088 B1* | 10/2001 | King | 438/342 |
| 6,373,086 B1 | 4/2002 | Mandelman et al. | 257/301 |
| 6,608,341 B2* | 8/2003 | Schrems | 257/301 |
| 6,696,717 B2* | 2/2004 | Chang et al. | 257/301 |
| 6,744,089 B2 | 6/2004 | Wu | 257/301 |
| 6,767,789 B1 | 7/2004 | Bronner et al. | 438/254 |
| 7,019,350 B2* | 3/2006 | Hsu | 257/301 |
| 7,078,291 B2* | 7/2006 | Hsu | 438/249 |
| 2002/0125521 A1 | 9/2002 | Schrems | 257/301 |
| 2004/0159873 A1 | 8/2004 | Goldbach et al. | 257/301 |
| 2004/0195612 A1 | 10/2004 | Divakaruni et al. | 257/301 |
| 2004/0209436 A1* | 10/2004 | Chen | 438/386 |
| 2004/0219747 A1* | 11/2004 | Lin et al. | 438/249 |
| 2005/0026359 A1* | 2/2005 | Voigt | 257/301 |
| 2005/0035389 A1 | 2/2005 | Bulsara et al. | 257/301 |

(Continued)

FOREIGN PATENT DOCUMENTS

JP    63226058 A    9/1988

*Primary Examiner*—T. N. Quach
(74) *Attorney, Agent, or Firm*—Schmeiser, Olsen & Watts; Steven Capella

(57) ABSTRACT

A DRAM cell with a self-aligned gradient P-well and a method for forming the same. The DRAM cell includes (a) a semiconductor substrate; (b) an electrically conducting region including a first portion, a second portion, and a third portion; (c) a first doped semiconductor region wrapping around the first portion, but electrically insulated from the first portion by a capacitor dielectric layer; (d) a second doped semiconductor region wrapping around the second portion, but electrically insulated from the second portion by a collar dielectric layer. The second portion is on top of and electrically coupled to the first portion, and the third portion is on top of and electrically coupled to the second portion. The collar dielectric layer is in direct physical contact with the capacitor dielectric layer. When going away from the collar dielectric layer, a doping concentration of the second doped semiconductor region decreases.

11 Claims, 30 Drawing Sheets

U.S. PATENT DOCUMENTS

2005/0079680 A1* 4/2005 Chen et al. .................. 438/387
2005/0127423 A1* 6/2005 Hsu ........................... 257/301
2007/0057304 A1* 3/2007 Boescke et al. ............ 257/301

* cited by examiner

DRAM (DYNAMIC RANDOM ACCESS MEMORY) CELLS

BACKGROUND OF THE INVENTION

1. Technical Field

The present invention relates to DRAM (Dynamic Random Access Memory) cells, and more particularly, to DRAM cells with self-aligned gradient wells.

2. Related Art

In a typical trench DRAM cell there exists a VPT (vertical parasitic transistor) that causes a leakage current during the normal operating of the DRAM cell. Therefore, there is a need for a structure and a method for forming the same of a DRAM cell in which the leakage current flowing through the VPT is reduced without compromising other device characteristics.

SUMMARY OF THE INVENTION

The present invention provides a semiconductor structure, comprising (a) a semiconductor substrate; (b) an electrically conducting region in the semiconductor substrate, wherein the electrically conducting region includes a first portion, a second portion, and a third portion, and wherein the second portion is on top of and electrically coupled to the first portion, and the third portion is on top of and electrically coupled to the second portion; (c) a first doped semiconductor region (i) in the semiconductor substrate, (ii) wrapping around side walls and a bottom wall of the first portion of the electrically conducting region, but (iii) electrically insulated from the electrically conducting region by a capacitor dielectric layer; and (d) a second doped semiconductor region (i) in the semiconductor substrate, (ii) wrapping around side walls of the second portion, but (iii) electrically insulated from the second portion by a collar dielectric layer, where in the second doped semiconductor region is self-aligned to the first doped semiconductor region, wherein the collar dielectric layer is in direct physical contact with the capacitor dielectric layer, and wherein when going from an interfacing surface of the collar dielectric layer and the second doped semiconductor region and away from the collar dielectric layer, a doping concentration of the second doped semiconductor region decreases.

The present invention also provides a semiconductor structure, comprising (a) a semiconductor substrate; (b) an electrically conducting region in the semiconductor substrate, wherein the electrically conducting region includes a first portion, a second portion, and a third portion, and wherein the second portion is on top of and electrically coupled to the first portion, and the third portion is on top of and electrically coupled to the second portion; (c) a first doped semiconductor region (i) in the semiconductor substrate, (ii) wrapping around side walls and a bottom wall of the first portion, but (iii) electrically insulated from the first portion by a capacitor dielectric layer; and (d) a second doped semiconductor region (i) in the semiconductor substrate, (ii) wrapping around side walls of the second portion, but (iii) electrically insulated from the second portion by a collar dielectric layer, wherein the second doped semiconductor region is self-aligned to the first doped semiconductor region, wherein the collar dielectric layer is in direct physical contact with the capacitor dielectric layer, wherein when going from an interfacing surface of the collar dielectric layer and the second doped semiconductor region and away from the collar dielectric layer, a doping concentration of the second doped semiconductor region decreases, wherein a thickness of the capacitor dielectric layer is less than a thickness of the collar dielectric layer, wherein the electrically conducting region comprises dopants having a first doping polarity, wherein the first doped semiconductor region comprises dopants having the first doping polarity, and wherein the second doped semiconductor region comprises dopants having a second doping polarity which is opposite to the first doping polarity.

The present invention provides a semiconductor fabrication method, comprising providing a semiconductor structure which includes (a) a semiconductor substrate, (b) a deep trench in the semiconductor substrate, wherein the deep trench comprises a side wall and a bottom wall, and wherein the side wall comprises an upper side wall portion and a lower side wall portion; forming a first doped semiconductor region and a second doped semiconductor region, wherein the first doped semiconductor region (i) wraps around the lower side wall portion of the deep trench and (ii) abuts the bottom wall and the lower side wall portion of the deep trench, wherein the second doped semiconductor region wraps around and abuts the upper side wall portion of the deep trench, wherein the second doped semiconductor region is self-aligned to the first doped semiconductor region, wherein the first doped semiconductor region comprises dopants of a first doping polarity, wherein the second doped semiconductor region comprises dopants of a second doping polarity which is opposite to the first doping polarity; and forming a dielectric layer and an electrically conducting region in the deep trench, wherein the dielectric layer is on the side wall and the bottom wall of the deep trench, wherein the dielectric layer comprises a capacitor dielectric portion and a collar dielectric portion, wherein the electrically conducting region comprises a first portion, a second portion, and a third portion, wherein the second portion is on top of and electrically coupled to the first portion, and the third portion is on top of and electrically coupled to the second portion, and wherein when going from an interfacing surface of the collar dielectric portion and the second doped semiconductor region and away from the collar dielectric portion, a doping concentration of the second doped semiconductor region decreases.

The present invention also provides a semiconductor fabrication method, comprising providing a semiconductor structure which includes (a) a semiconductor substrate, (b) an electrically conducting region in the semiconductor substrate, wherein the electrically conducting region includes a first portion, a second portion, and a third portion, and wherein the second portion is on top of and electrically coupled to the first portion, and the third portion is on top of and electrically coupled to the second portion, (c) a first doped semiconductor region (i) in the semiconductor substrate, (ii) wrapping around side walls and a bottom wall of the first portion, but (iii) electrically insulated from the first portion by a capacitor dielectric layer, and (d) a second doped semiconductor region (i) in the semiconductor substrate, (ii) wrapping around side walls of the second portion, but (iii) electrically insulated from the second portion by a collar dielectric layer, wherein the collar dielectric layer is in direct physical contact with the capacitor dielectric layer, and wherein when going from an interfacing surface of the collar dielectric layer and the second doped semiconductor region and away from the collar dielectric layer, a doping concentration of the second doped semiconductor region decreases The present invention provides a DRAM cell (and a method for operating the same) with a gradient P-well self-aligned to the buried plate to reduce the leakage current through the VPT (vertical parasitic transistor).

DETAILED DESCRIPTION OF THE INVENTION

FIGS. 1-25 show a first fabrication process for forming a DRAM (Dynamic Random Access Memory) cell structure 100, in accordance with embodiments of the present invention.

Figure 1:
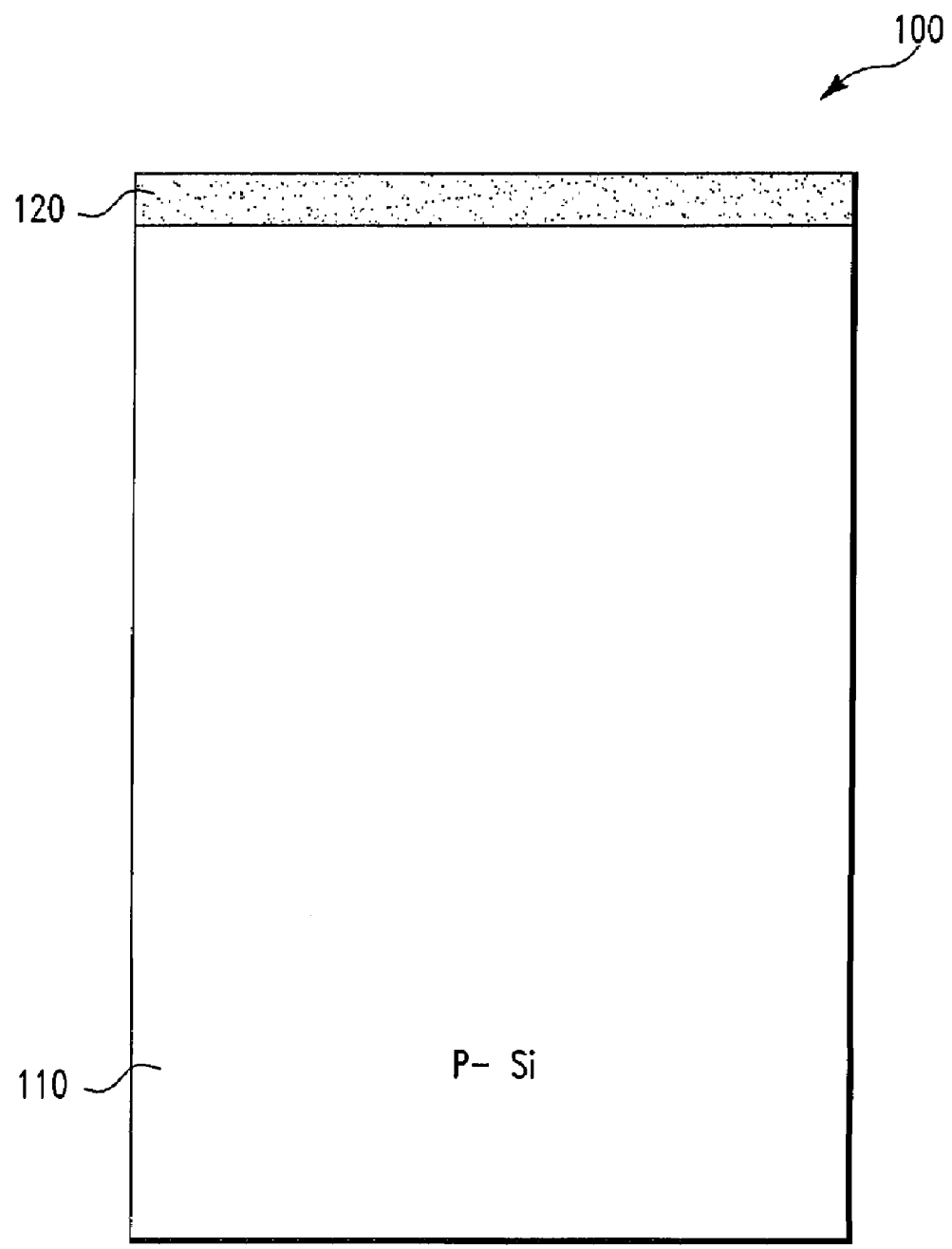
FIGS. 1-25 show a first fabrication process of a DRAM cell with a self-aligned gradient P-well, in accordance with embodiments of the present invention.

More specifically, with reference to FIG. 1, in one embodiment, the first fabrication process starts out with a semiconductor substrate 110 such as a lightly doped silicon substrate. Other suitable alternative types of substrates include germanium (Ge), silicon germanium (SiGe), silicon carbide (SiC), and those consisting essentially of one or more compound semiconductors such as gallium arsenic (GaAs), gallium nitride (GaN), and indium phosphoride (InP). Alternatively, the substrate has a semiconductor-on-insulator type structure, e.g., a silicon-on-insulator (SOI) substrate.

Next, in one embodiment, a pad oxide layer 120 is formed on top of the semiconductor substrate 110 by thermal oxidation. Alternatively, the pad oxide layer 120 can be formed by using a deposition technique such as CVD (Chemical Vapor Deposition) method.

Figure 2:
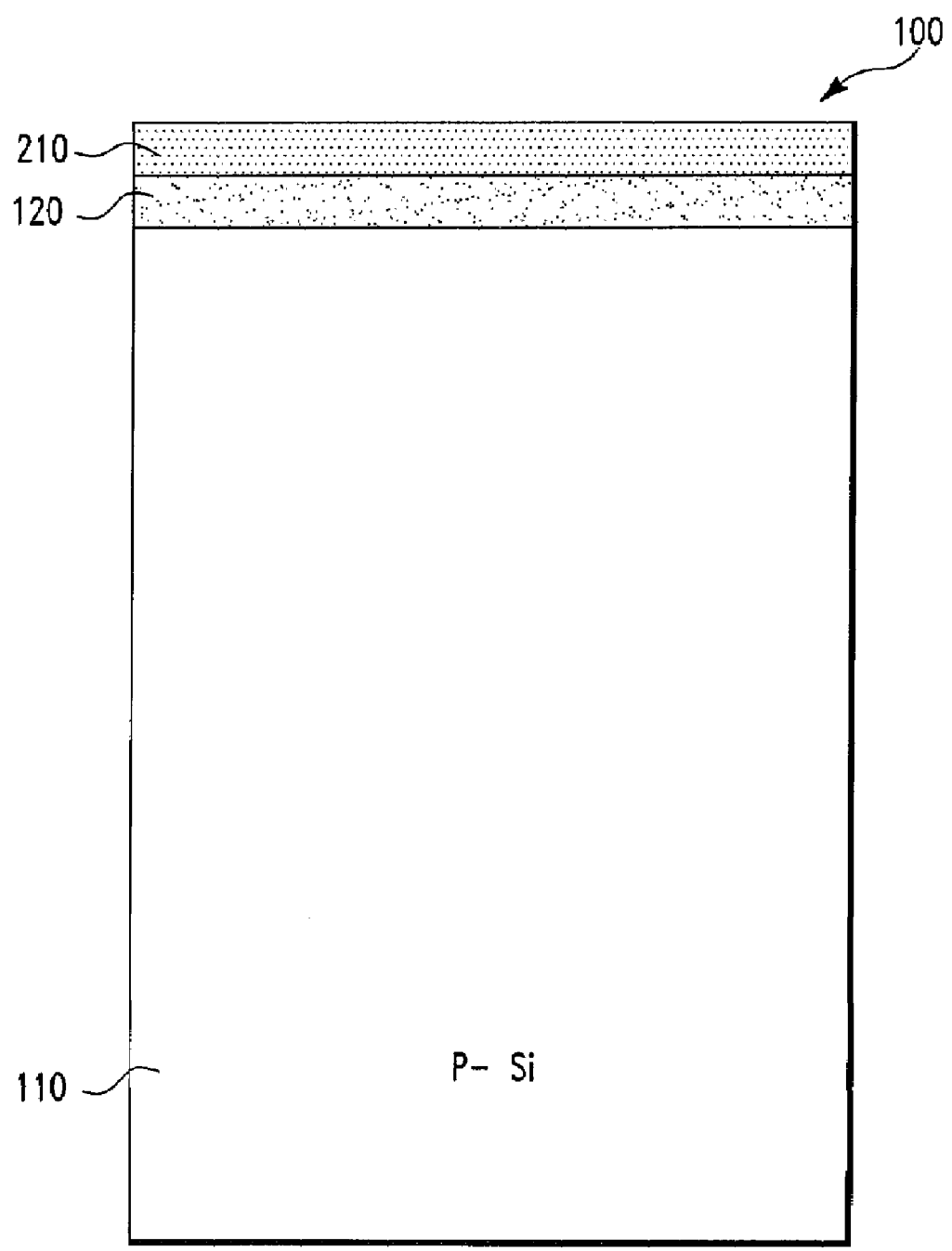

Next, with reference to FIG. 2, in one embodiment, a pad nitride layer 210 is formed on top of the structure 100 of FIG. 1 using CVD method.

Figure 3:
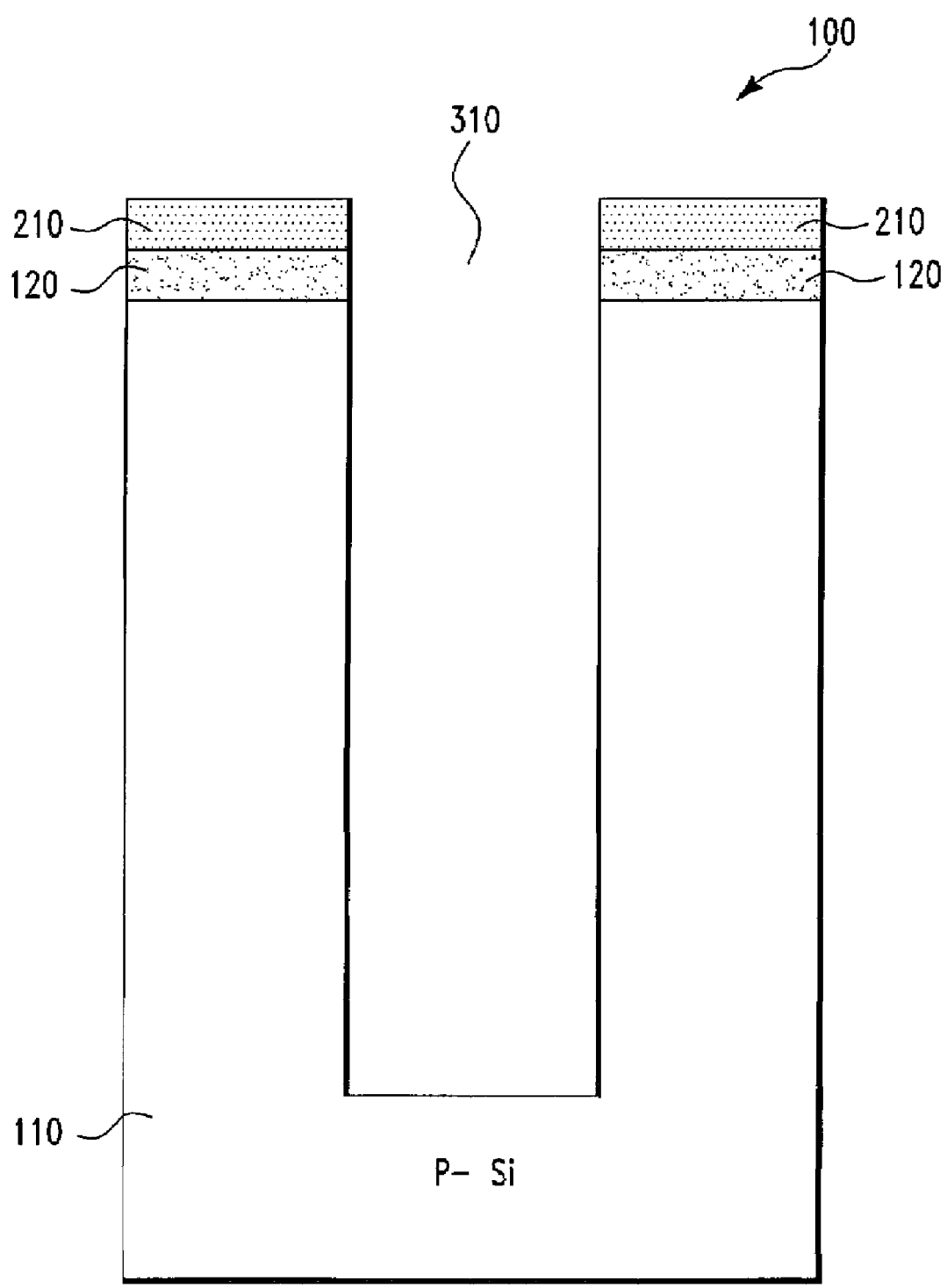

Next, with reference to FIG. 3, in one embodiment, a deep trench 310 is formed in the semiconductor substrate 110. Illustratively, the deep trench 310 is formed by (i) depositing a hardmask layer such as boron-doped oxide (not shown) on top of the pad nitride layer 210 (FIG. 2), (ii) patterning the deposited hardmask layer, pad nitride layer 210, and pad oxide layer 120, and (iii) etching the silicon substrate by a RIE (Reactive Ion Etching) process selective to the hardmask layer. The hardmask layer can be stripped after the deep trench 310 is formed or in any suitable later process steps.

Figure 4:
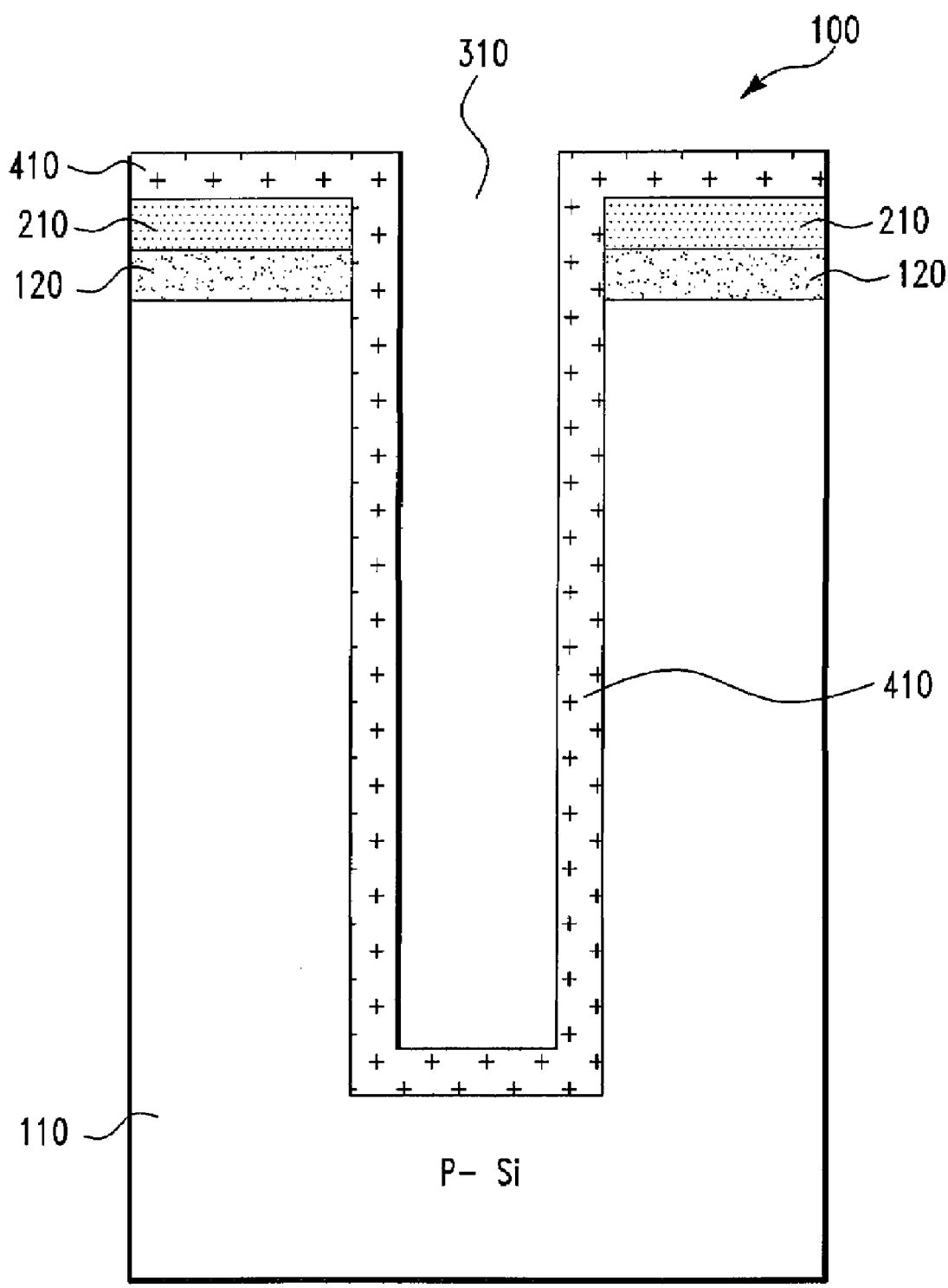

Next, with reference to FIG. 4, in one embodiment, a first dopant source layer 410 containing a first doping polarity is formed on top of the structure 100 of FIG. 3 including on side walls and on a bottom wall of the deep trench 310 (FIG. 3). Illustratively, an ASG (arsenic silicate glass) layer 410 with a thickness 50-1000 angstroms is formed by CVD or ALD (atomic layer deposition) method as the dopant source for N-type dopants, resulting in the structure 100 of FIG. 4. Alternatively, other materials such as oxide doped with phosphorus, antimony, or any combination of these dopants can be used as the dopant source for N-type dopants.

Figure 5:
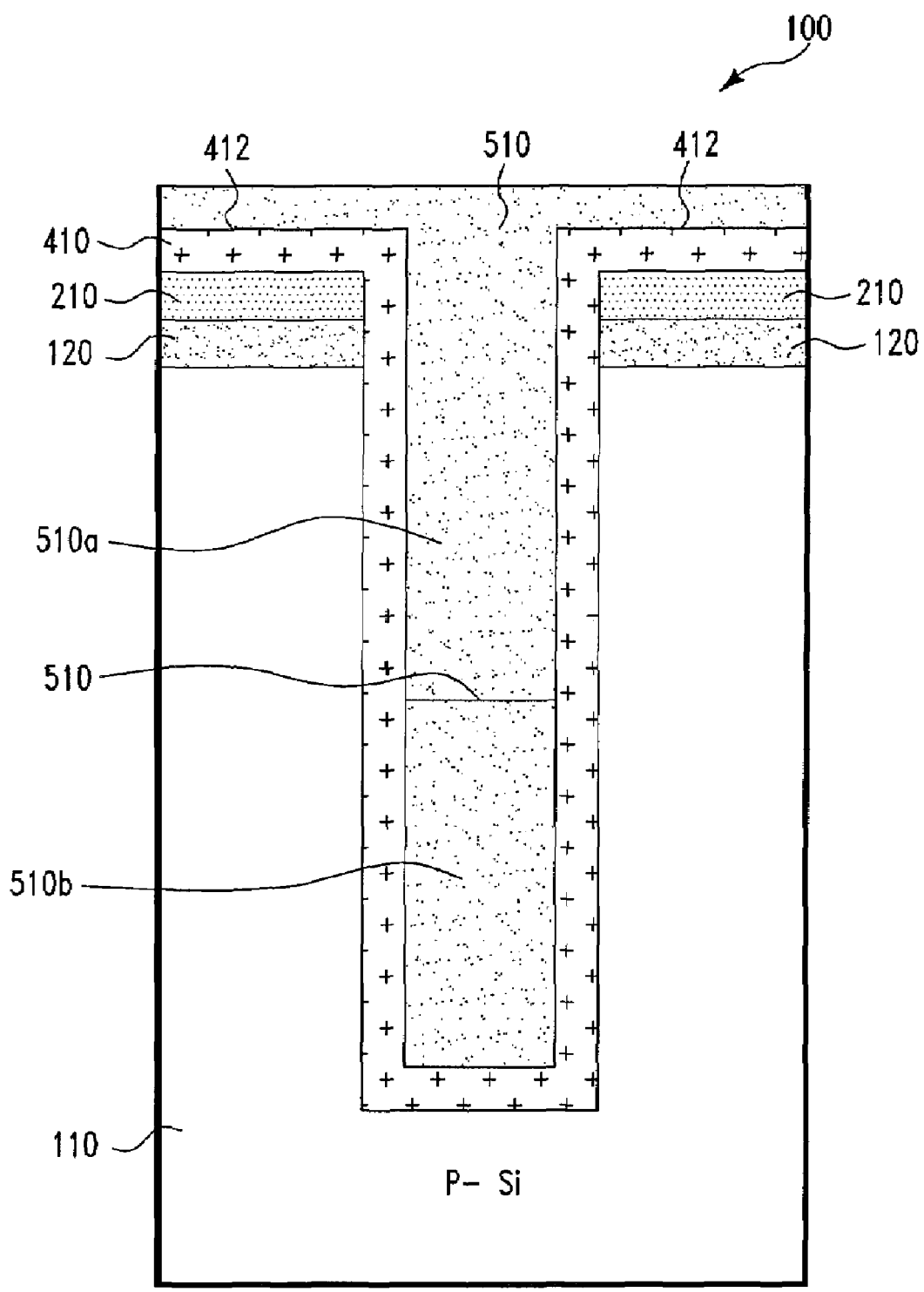

Next, with reference to FIG. 5, in one embodiment, the deep trench 130 is filled with a sacrificial material 510. Preferably, the sacrificial material 510 is a polymer such as a resist or SiLK®, the latter of which is available from Dow Chemical. Illustratively, the sacrificial material 510 is formed by a conventional coating technique.

Figure 6:
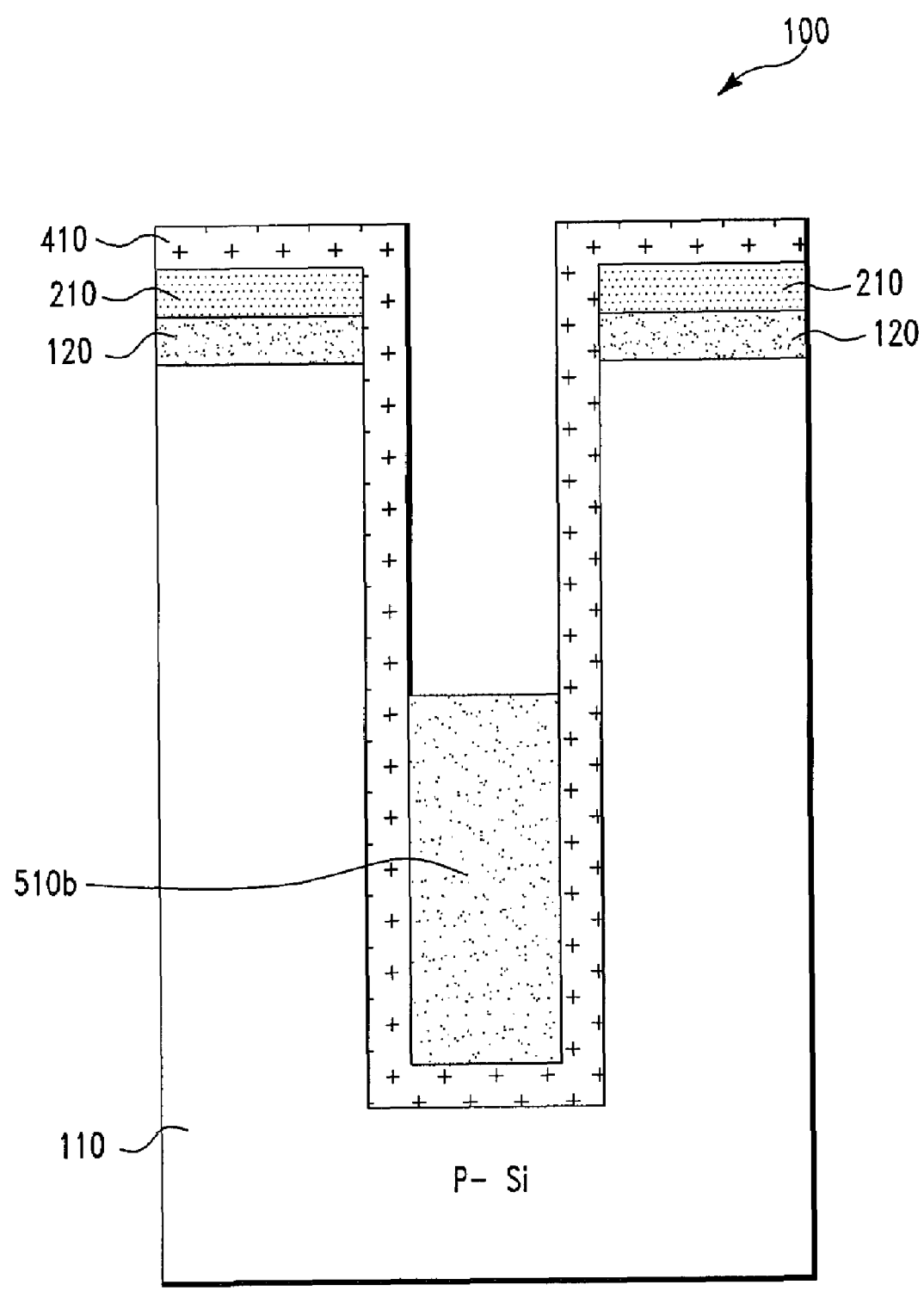

Next, in one embodiment, a top portion 510a of the sacrificial material 510 is recessed to a predetermined depth and a bottom portion 510b of the sacrificial material 510 still remains as shown in FIG. 6. A conventional RIE, CDE (chemical downstream etch), or other suitable process can be used for recessing the sacrificial material 510. Hereafter, the bottom portion 510b of the sacrificial material 510 is referred to as a sacrificial material region 510b.

Figure 7:
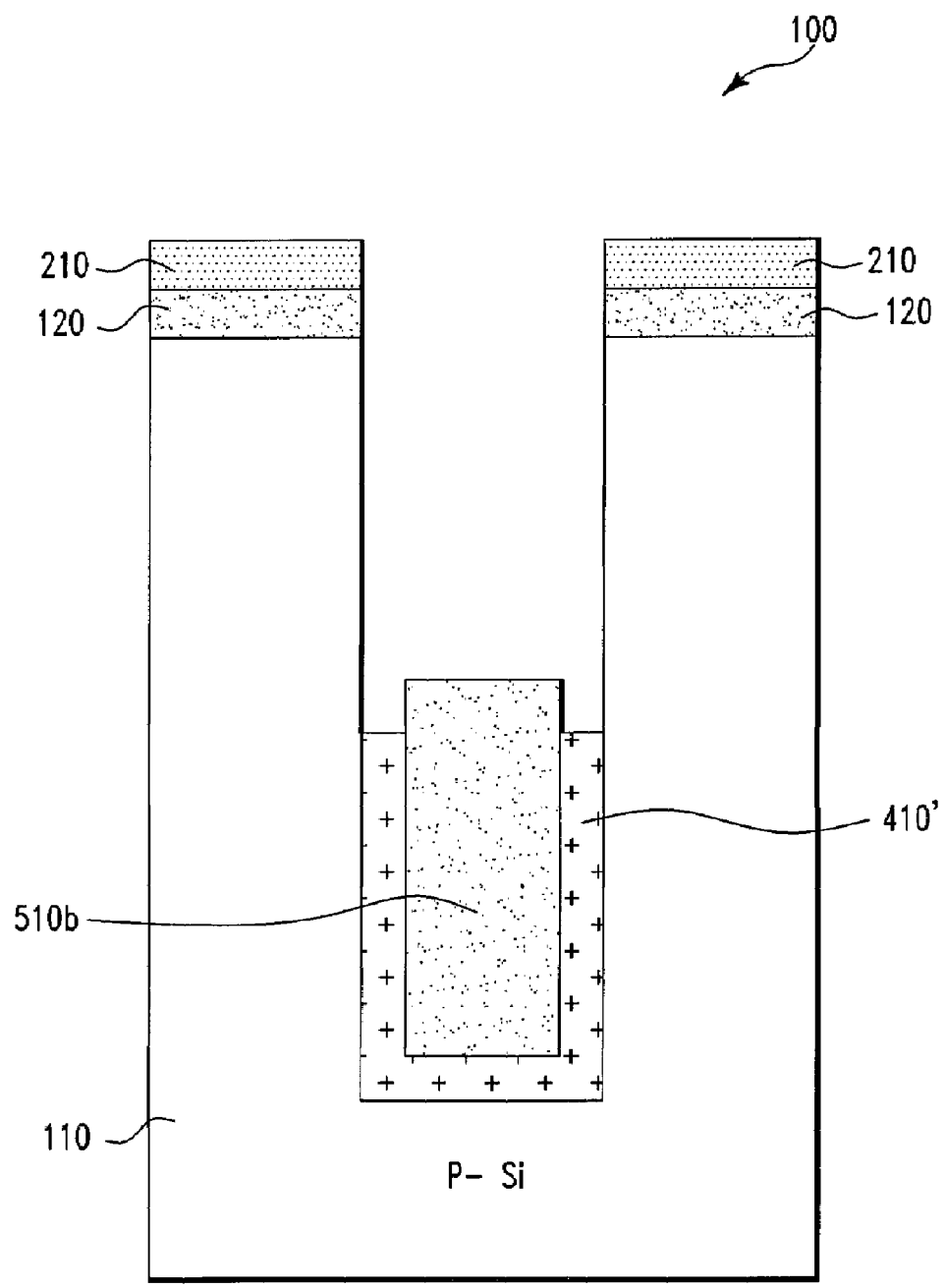

Next, with reference to FIG. 6, in one embodiment, the exposed portion of the ASG layer 410 is removed by, illustratively, wet etching with an enchant containing hydrofluoric acid, resulting in the ASG region 410' as shown in FIG. 7.

Figure 8:
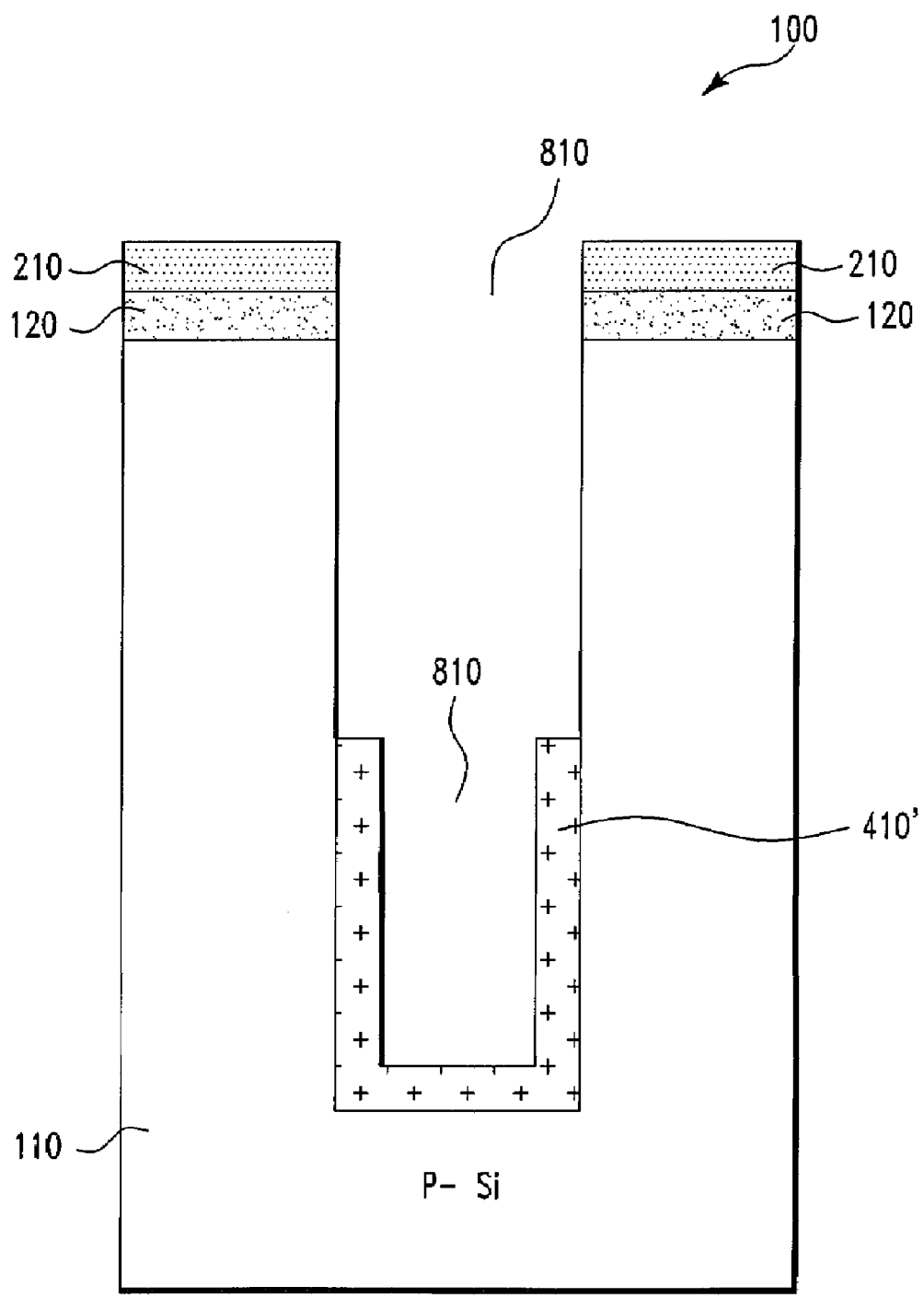

Next, with reference to FIG. 7, in one embodiment, the sacrificial material region 510b, when it is a resist, is removed by, illustratively, wet etching with an enchant containing sulfuric acid and hydrogen peroxide, resulting in a trench 810 as shown in FIG. 8. Alternatively, the sacrificial material region 510b is removed by a dry etch process Next, with reference to FIG. 9, in one embodiment, a second dopant source layer 910 is formed on top of the structure 100 of FIG. 8 including side walls and a bottom wall of the trench 810 (FIG. 8). Dopants in the second dopant source layer 910 have the opposite polarity to the doping polarity of dopants in the first dopant source layer 410. Preferably, the dopant concentration in the second dopant source layer 910 is lower than the dopant concentration in the first dopant source layer 410 and the thickness of the second dopant source layer 910 is less than the thickness of the first dopant source layer 410 to facilitate the formation of self-aligned P-well and buried plate in later processes. Illustratively, a BSG (borosilicate glass) layer 910 with a thickness of 20-300 angstroms formed by CVD, ALD, or thermal deposition as the second dopant source layer. Alternatively, other suitable dopant source materials such as an oxide containing indium can be used.

Figure 9:
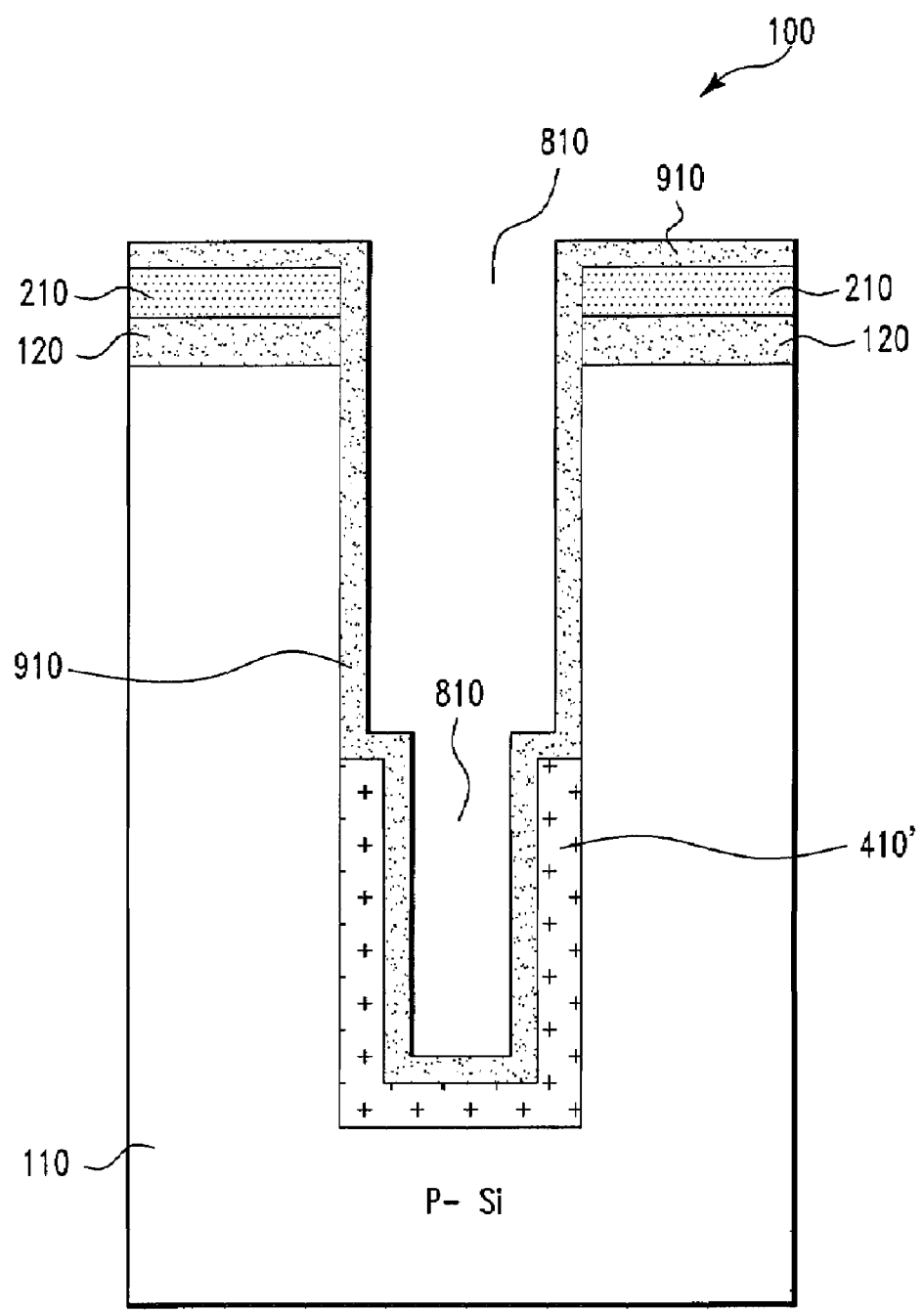
Figure 10:
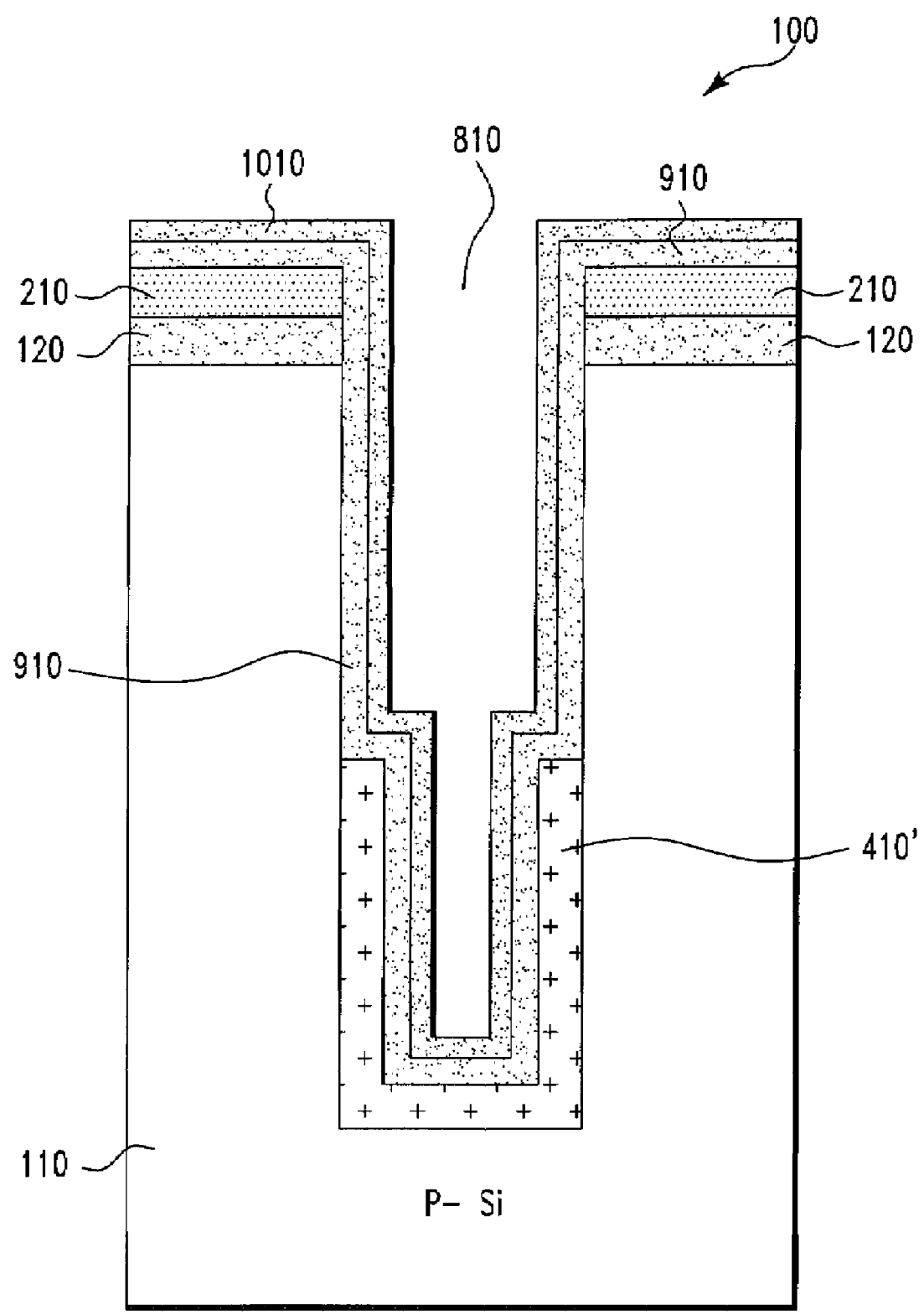

Next, with reference to FIG. 10, in one embodiment, a cap layer 1010 is formed on top of the structure 100 including on side walls and on a bottom wall of the trench 810 (FIG. 9). Illustratively, the cap layer 1010 is formed by CVD or ALD of silicon dioxide ($SiO_2$).

Figure 11:
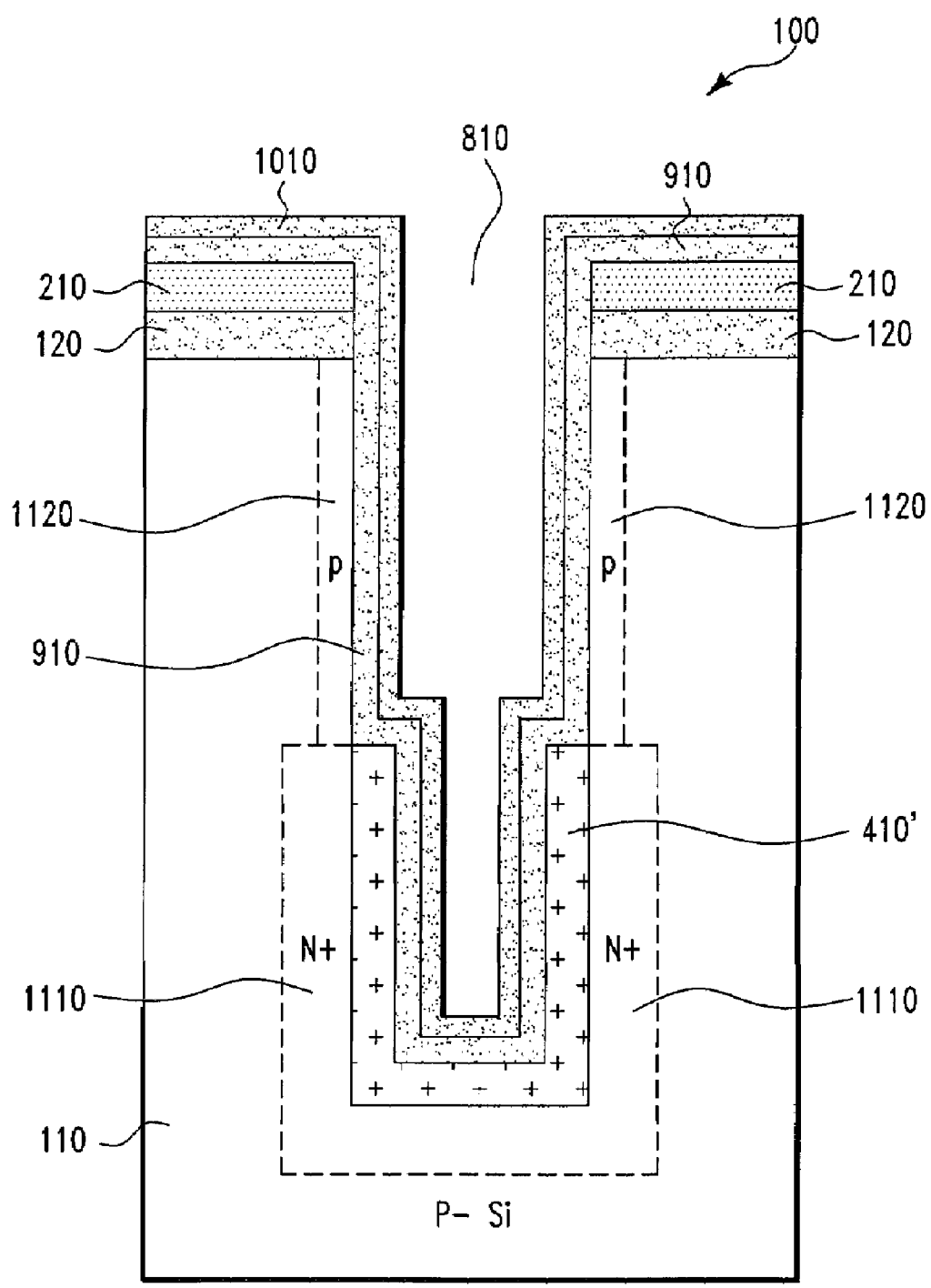

Next, in one embodiment, the structure 100 of FIG. 10 is annealed at a high temperature (e.g., 700-1100° C.). As a result, arsenic dopants in the ASG region 410' diffuse into the semiconductor substrate 110, resulting in an N+ buried plate 1110; and boron dopants in the BSG layer 910 diffuse into the semiconductor substrate 110, resulting in a gradient P-well 1120 which is self-aligned to the buried plate 1110, as shown in FIG. 11.

In one embodiment, the ASG layer 410' underneath the BSG layer 910 has a thickness greater than 400 angstroms prevents boron diffusion into the buried plate region 1110, resulting in only arsenic diffusion into the buried plate region 1110.

In another embodiment, the buried plate 1110 comprises both N-type dopants (coming from the ASG region 410') and P-type dopants (coming from the BSG layer 910). In one embodiment, in the buried plate 1110, the doping concentration of the N-type dopants is greater than the doping concentration of the P-type dopants. In other words, it is said that the buried plate 1110 electrically exhibits the N-type doping polarity.

In one embodiment, the doping concentration of the ASG region 410' is greater than the doping concentration of the BSG layer 910.

In one embodiment, the doping concentration of N-type dopants in the buried plate 1110 ranges preferably from $10^{18}$ to $10^{20}/cm^3$ and more preferably from $10^{19}$ to $5\times10^{19}/cm^3$. The doping concentration of P-type dopants in the buried plate region 1110, if present, is preferably less than 20%, and more preferably less than 10% of the doping concentration of N-type dopants. The doping concentration of P-type dopants in the gradient P-well 1120 ranges preferably from $10^{17}$ to $5\times10^{19}/cm^3$ and more preferably from $5\times10^{17}$ to $5\times10^{18}/cm^3$.

Figure 12:
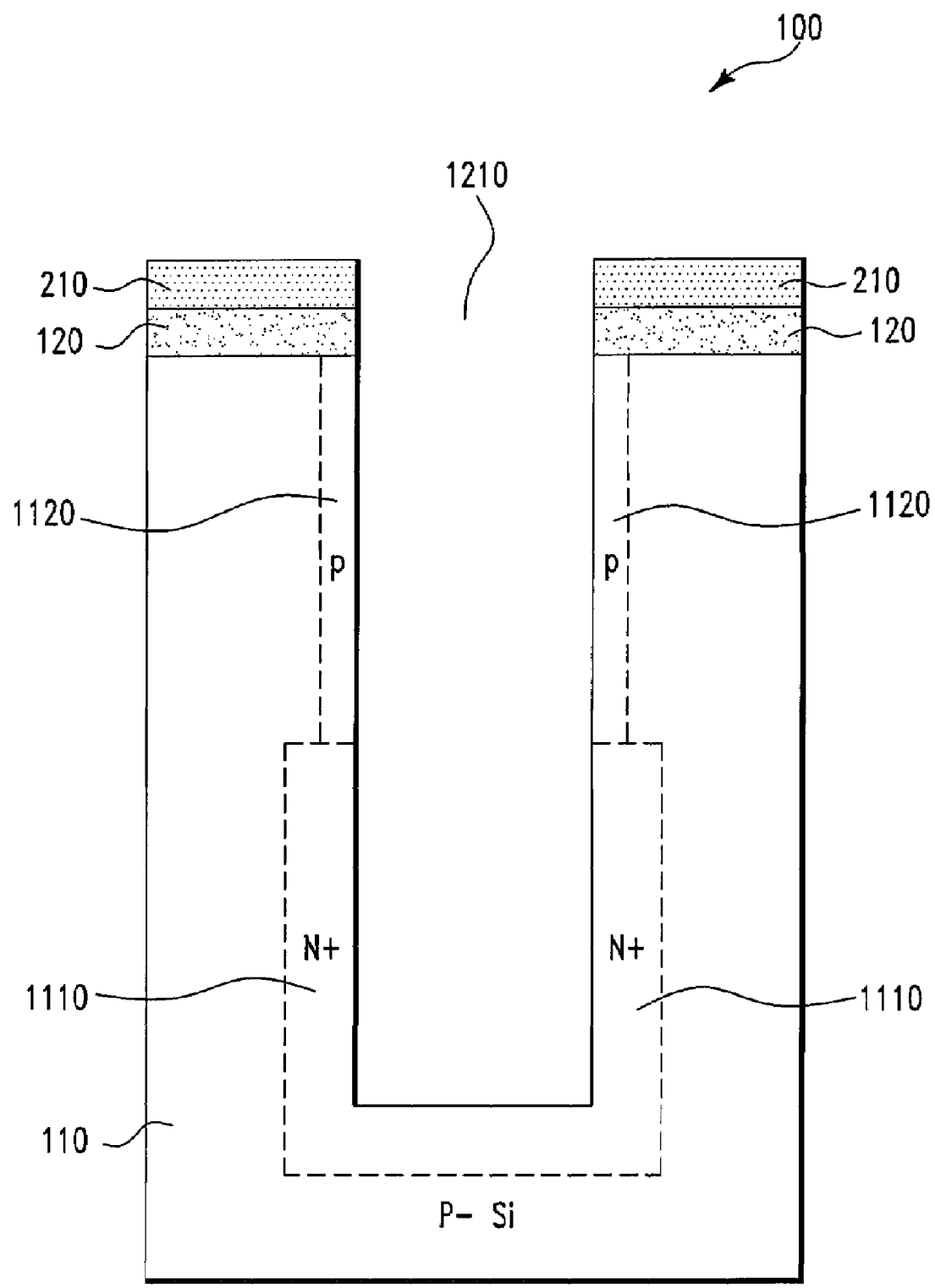

Next, with reference to FIG. 11, in one embodiment, the cap layer 1010, the BSG layer 910, and the ASG region 410' are removed by using wet etching with an etchant containing hydrofluoric acid, resulting in a trench 1210 as shown in FIG. 12.

Figure 13:
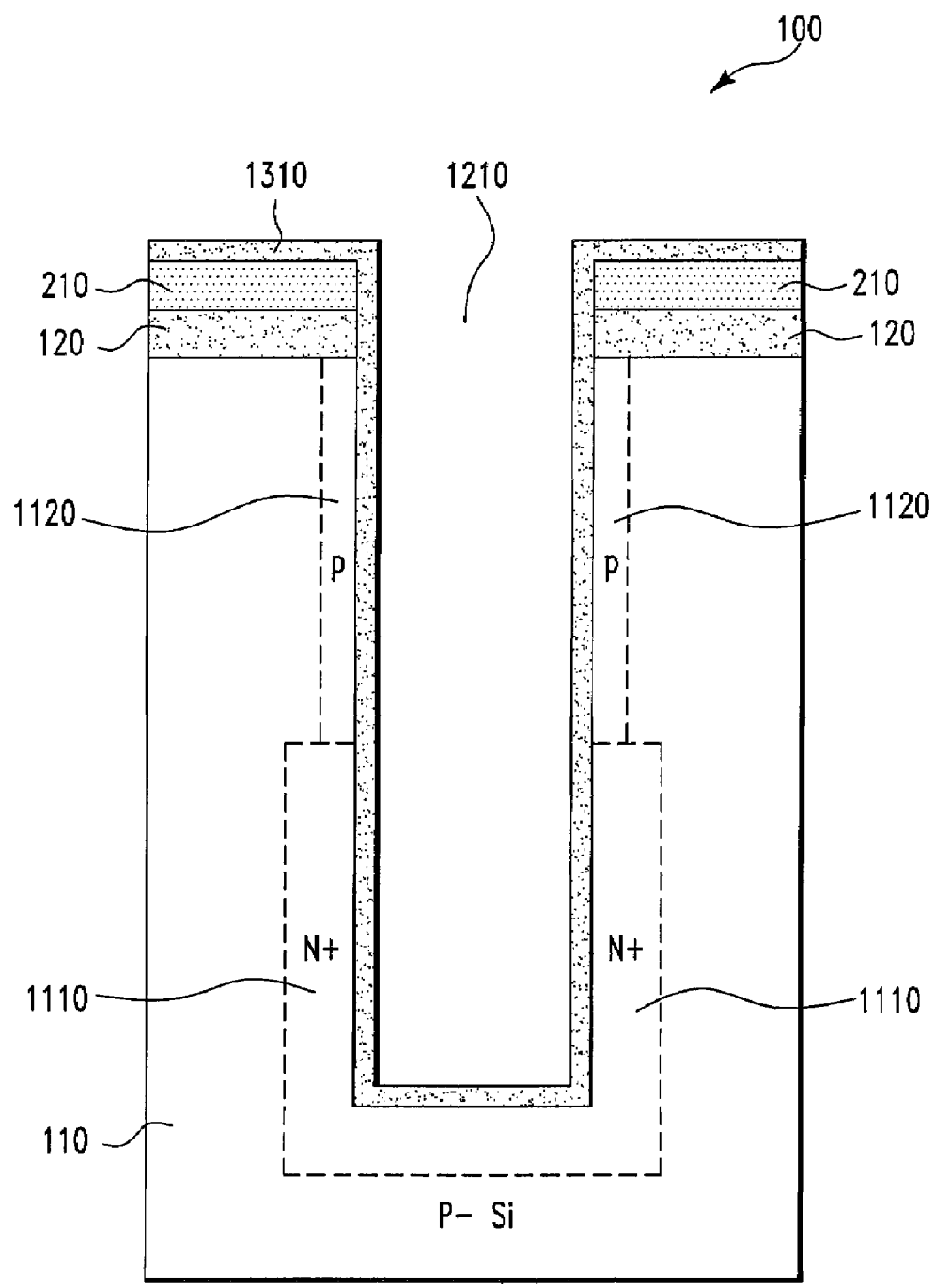

Next, with reference to FIG. 13, in one embodiment, a capacitor dielectric layer 1310 is formed on top of the structure 100 of FIG. 12 including on side walls and on a bottom wall of the trench 1210 (FIG. 12). Illustratively, the capacitor dielectric layer 1310 comprises silicon nitride. In one embodiment, the capacitor dielectric layer 1310 is formed by CVD of silicon nitride followed by a high temperature anneal (e.g., 800-1100° C.) in an environment containing oxygen. Alternatively, other suitable dielectric such as oxide, oxynitride, and/or "high-k" (high dielectric constant) materials.

Figure 14:
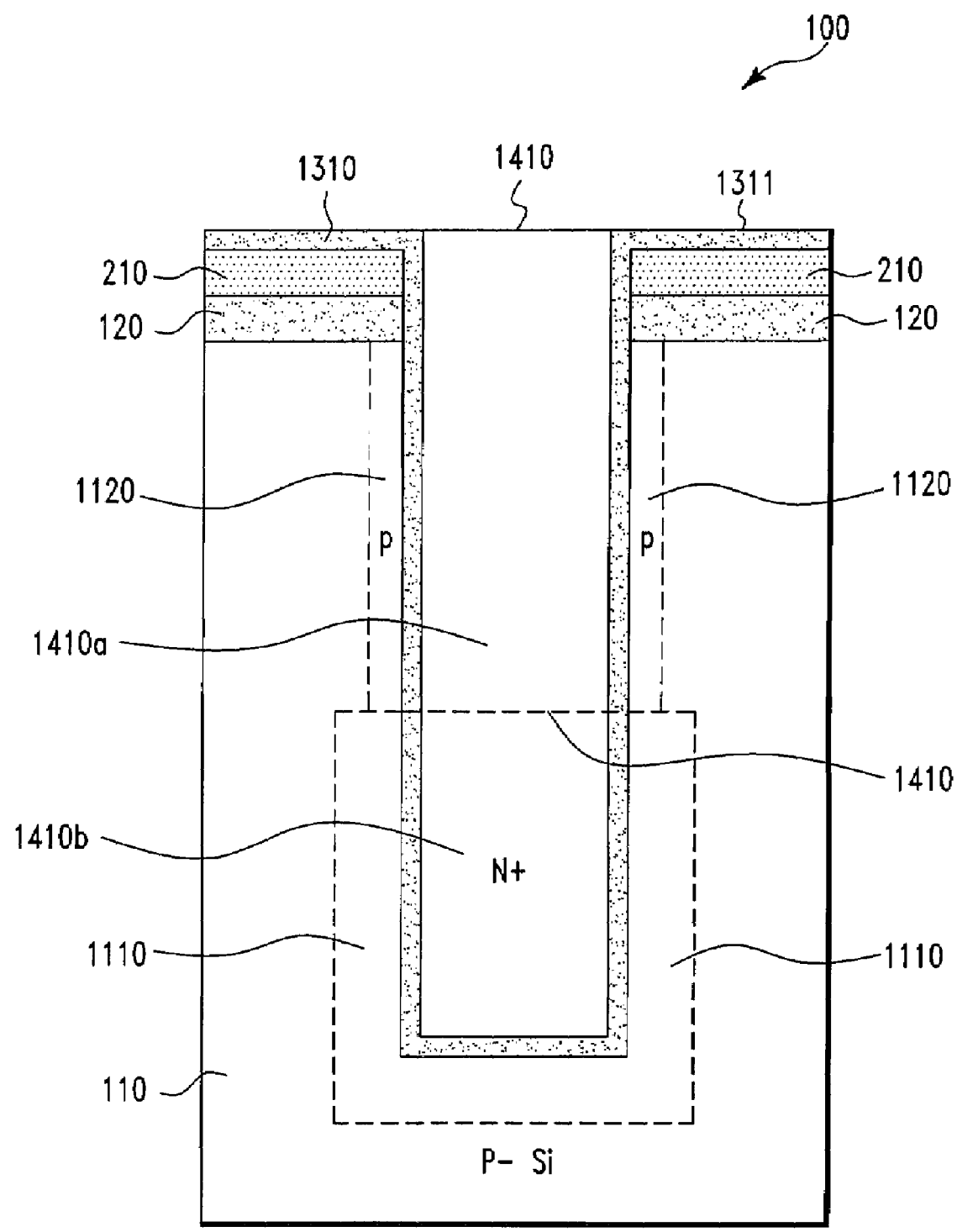

Next, with reference to FIG. 14, in one embodiment, a first conducting material (e.g., N+ polysilicon doped with arsenic, any metal such as tungsten, any conducting metallic compound such as tungsten silicide, or any other suitable conducting material) region 1410 is formed in the trench 1210 of FIG. 13. Illustratively, the first N+ polysilicon region 1410 is formed by CVD of a polysilicon layer (not shown) everywhere on top of the structure 100 (including in the trench 1210) of FIG. 13, and then (ii) optional planarization of the deposited polysilicon layer, e.g., by CMP (chemically mechanical polishing), until a top surface 1311 of the capacitor dielectric layer 1310 is exposed to the surrounding ambient as shown in FIG. 14.

Figure 15:
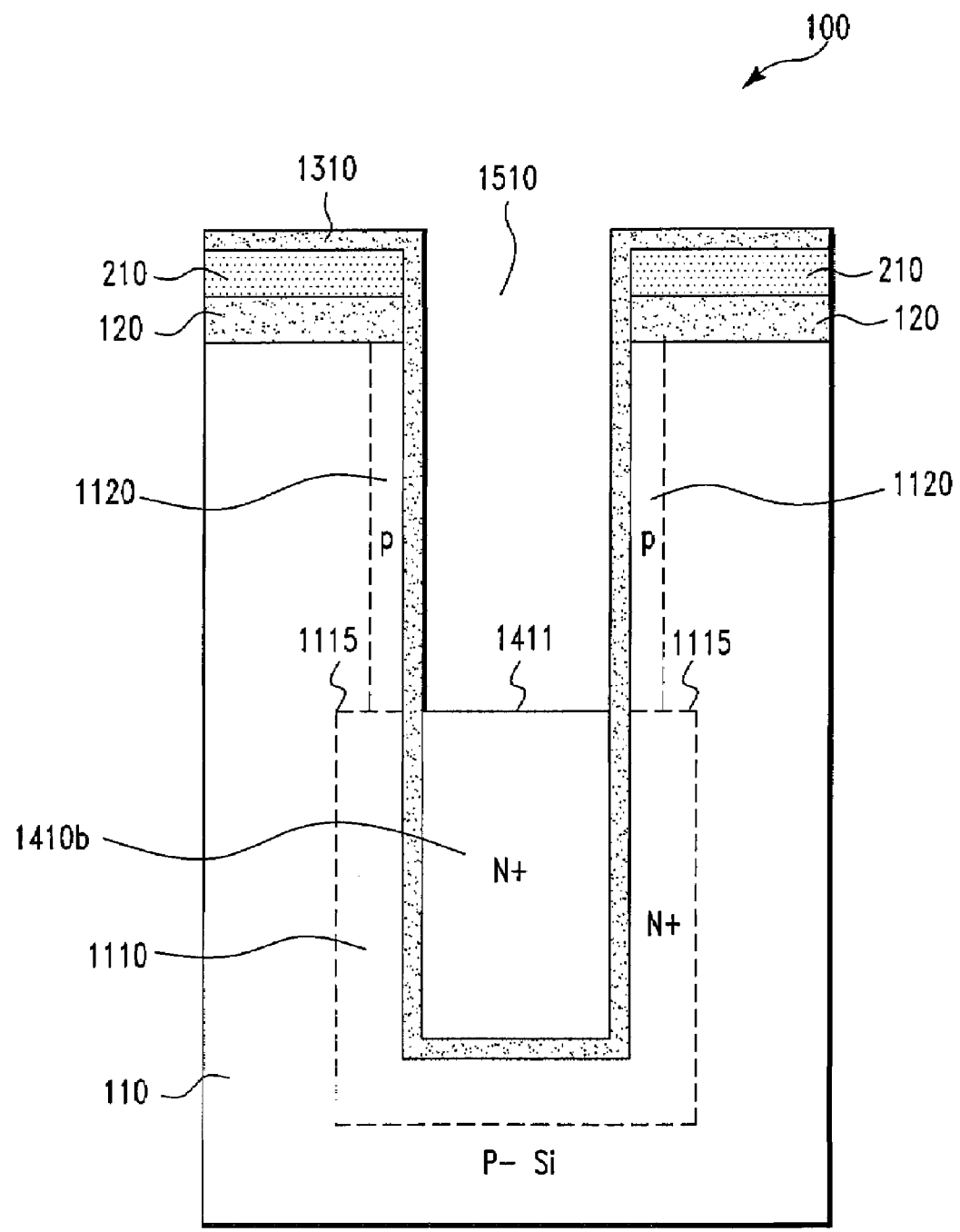

Next, in one embodiment, a top portion 1410a of the first N+ polysilicon region 1410 is removed by, illustratively, RIE process, resulting in a bottom portion 1410b of the first N+ polysilicon region 1410, and resulting in a trench 1510 as shown in FIG. 15. Hereafter the bottom portion 1410b is referred to as a first N+ polysilicon region 1410b.

Illustratively, with reference to FIG. 15, a top surface 1411 of the first N+ polysilicon region 1410b is essentially at a same level (i.e., coplanar) as a top surface 115 of the N+ buried plate 1110.

Figure 16:
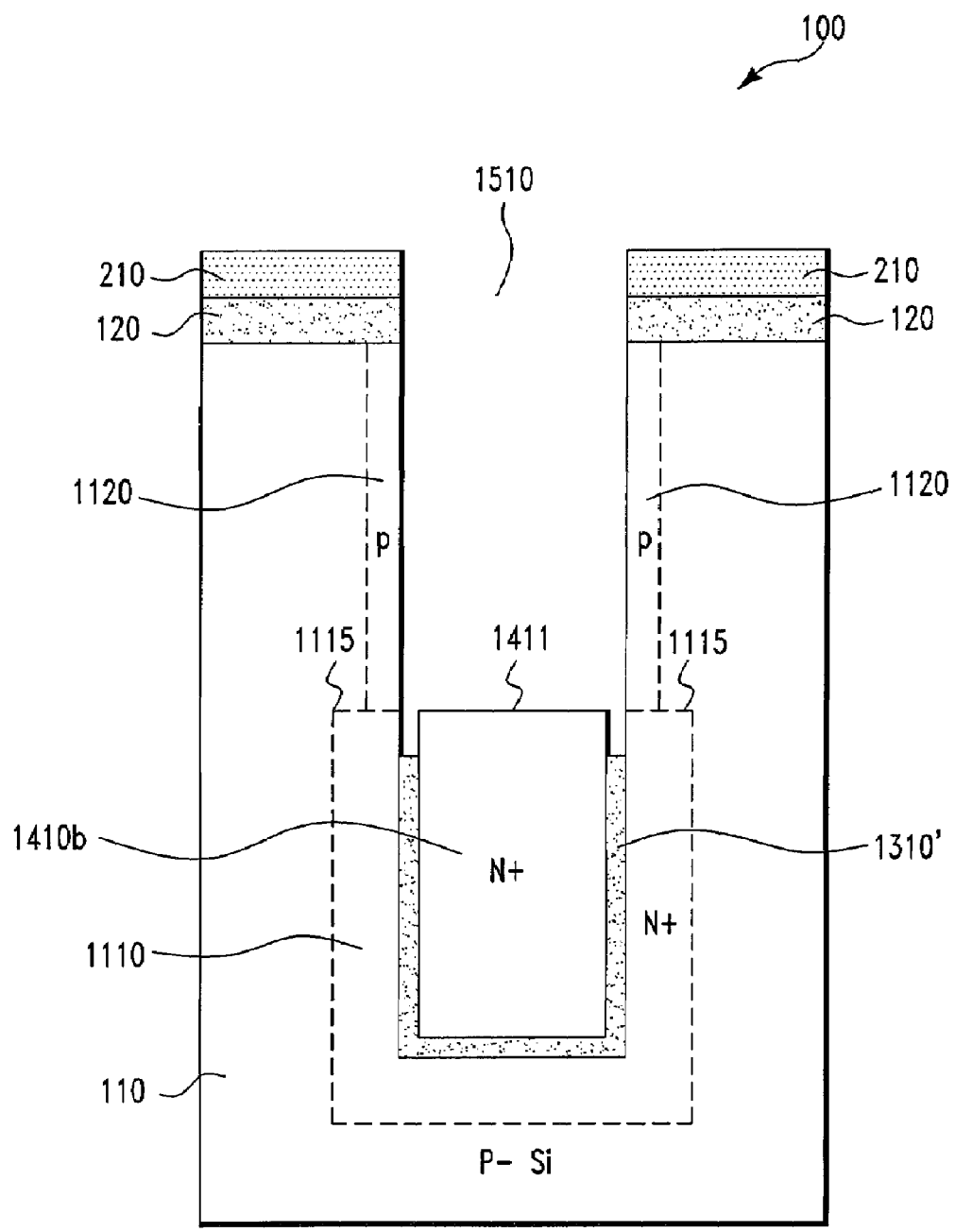

Next, in one embodiment, the exposed portion of the capacitor dielectric layer 1310 is removed by, illustratively, wet etching, resulting in a capacitor dielectric region 1310' as shown in FIG. 16.

Figure 17:
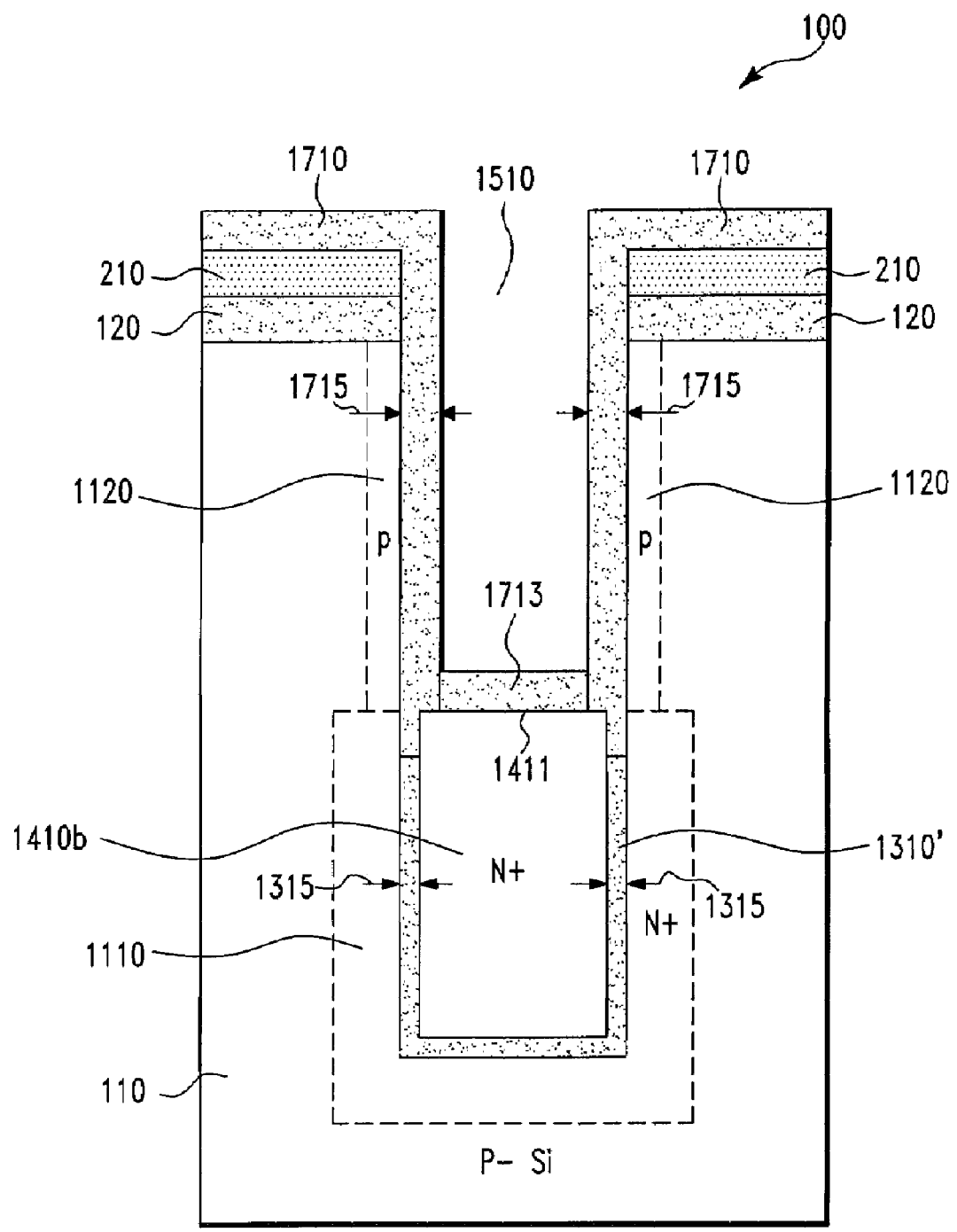

Next, with reference to FIG. 17, in one embodiment, a collar layer 1710 is formed on top of the structure 100 of FIG. 16 including on side walls and on a bottom wall of the trench 1510. Illustratively, the collar layer 1710 comprises silicon oxide. In one embodiment, the collar layer 1710 is formed by thermal oxidation. In another embodiment, the collar layer 1710 is formed by a deposition technique such as CVD or ALD (atomic layer deposition). Yet in a third embodiment, the collar layer 1710 is formed by thermal oxidation followed by a deposition. A high temperature annealing process (e.g., 700-1100° C. for 2-200 minutes) may be performed, after the collar layer 1710 is formed by deposition, to densify the deposited collar layer 1710 and improve the integrity of trench structure. In one embodiment, the collar layer 1710 essentially contains no or substantially low dopant concentration for the reason that excessive dopants in the collar 1710 otherwise would diffuse into the p-well and into the trench and cause undesired dopant variation in these regions. It should be noted that a first thickness 1715 of the collar layer 1710 is equal or greater than a second thickness 1315 of the capacitor dielectric region 1310'.

Figure 18:
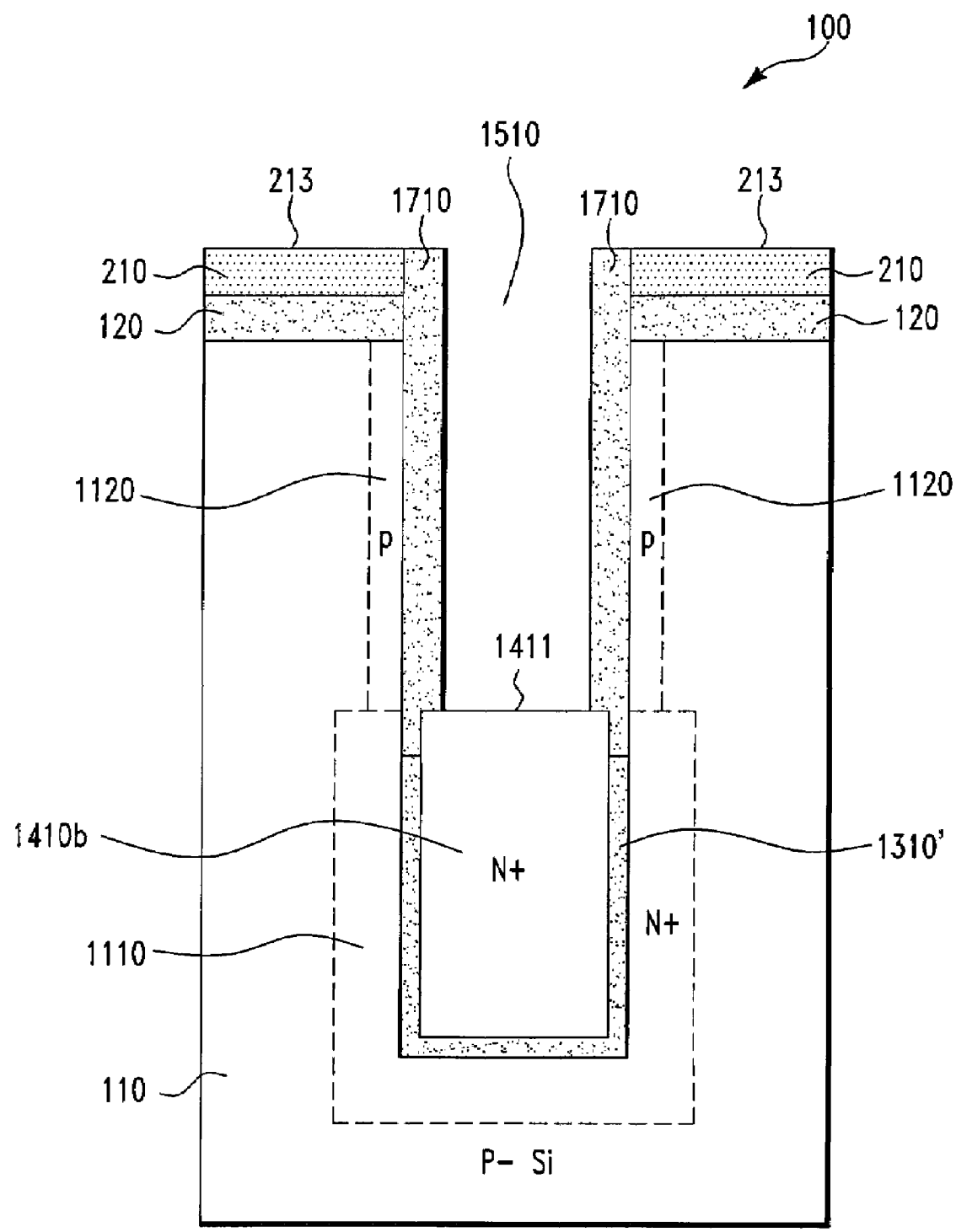

Next, in one embodiment, a bottom portion 1713 and a portion 1714 of the collar layer 1710 are removed by, illustratively, RIE process such that the top surface 1411 of the first N+ polysilicon region 1410 and a top surface 213 of the pad nitride layer 210 are exposed to the surrounding ambient, and such that the collar layer 1710 still remains on the side walls of the trench 1510, as shown in FIG. 18.

Figure 19:
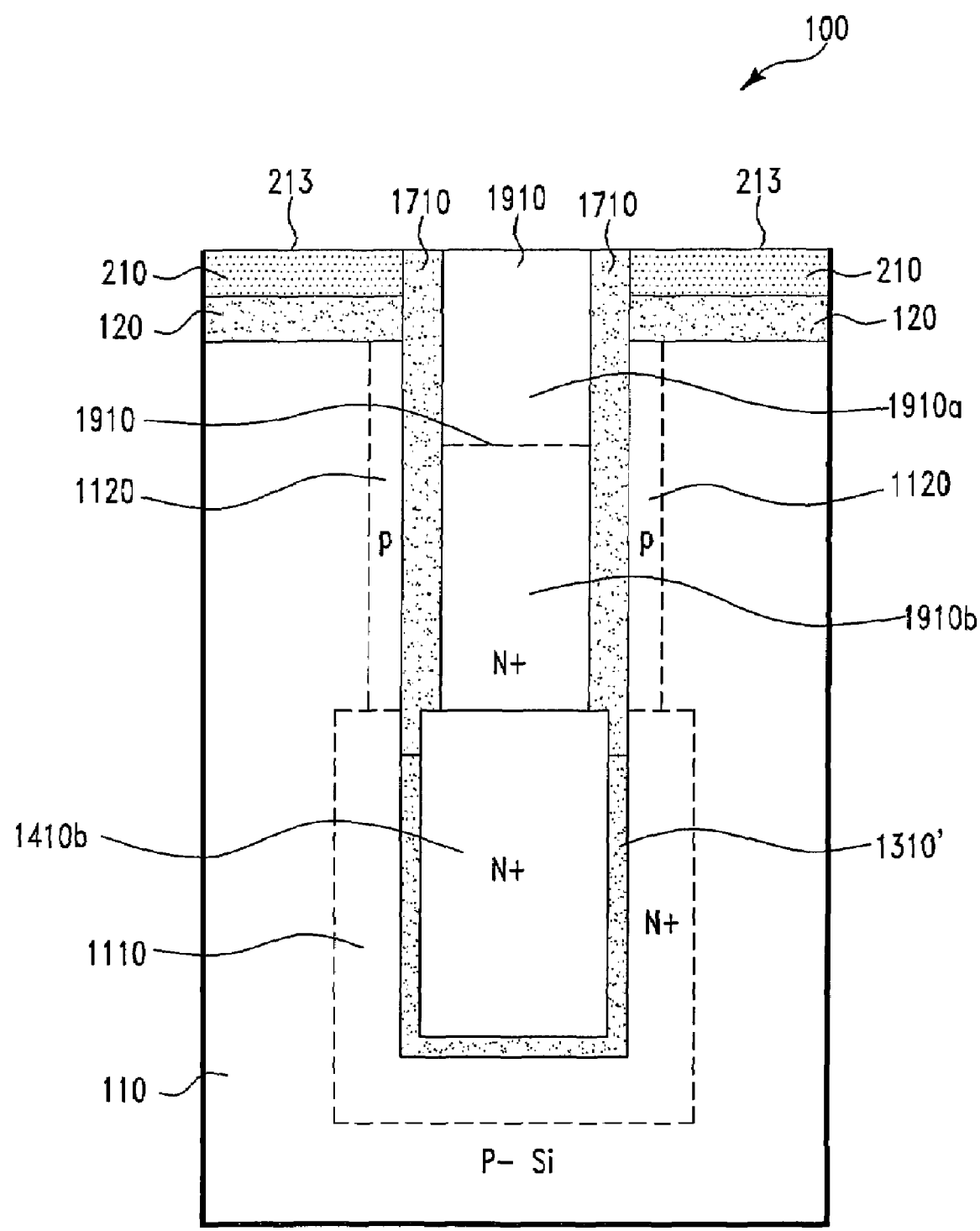

Next, with reference to FIG. 19, in one embodiment, a second conducting material (e.g., N+ polysilicon) region 1910 is formed in the trench 1510 of FIG. 18. Illustratively, the second N+ polysilicon region 1910 is formed by (i) CVD of a polysilicon layer (not shown) everywhere on top of the structure 100 (including in the trench 1510) of FIG. 18, and then (ii) optional planarization of the deposited polysilicon layer, e.g., by CMP, until the top surface 213 of the pad nitride layer 210 is exposed to the surrounding ambient, as shown in FIG. 19.

Figure 20:
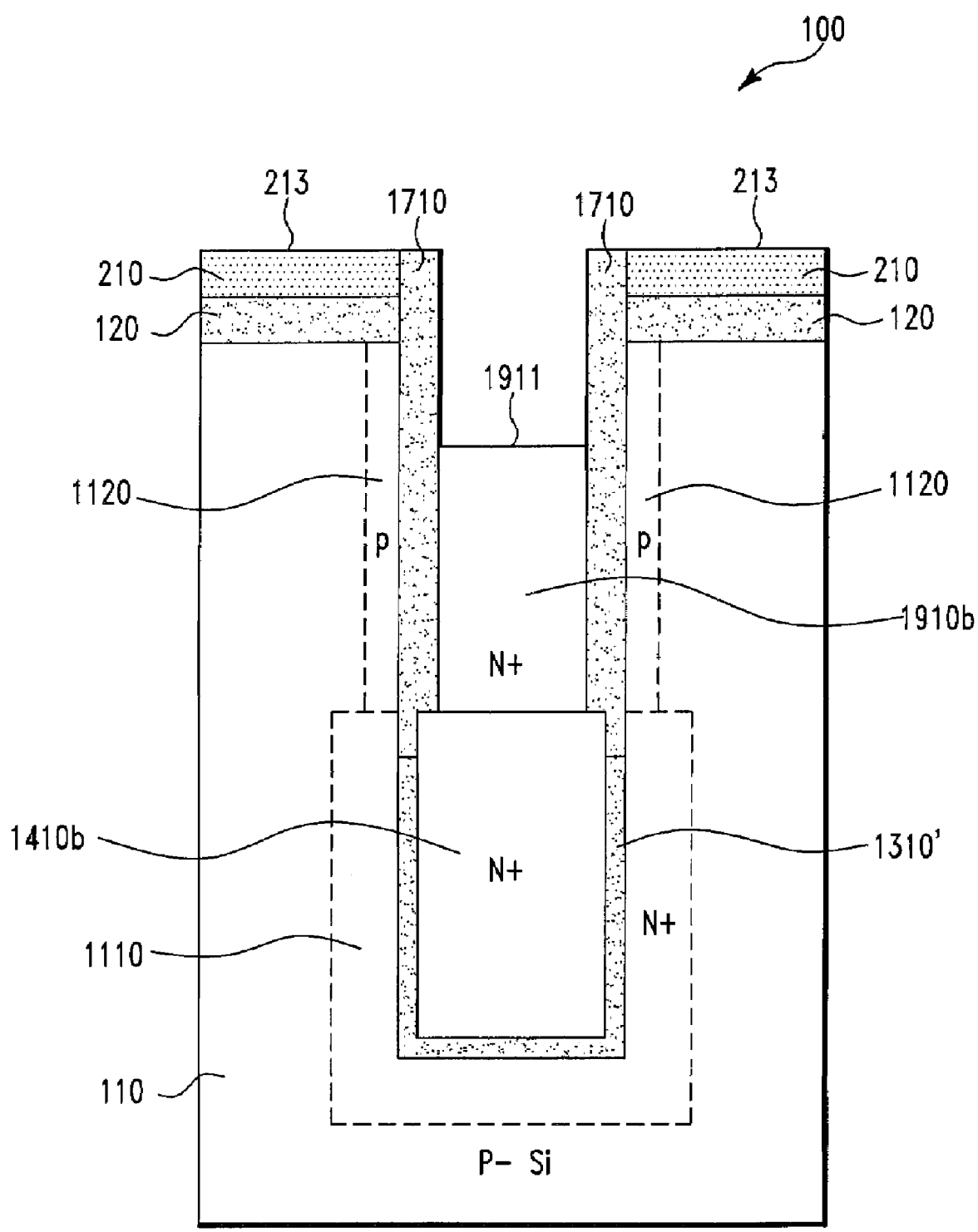

Next, in one embodiment, a top portion 1910a of the second N+ polysilicon region 1910 is removed by, illustratively, RIE process, resulting in a bottom portion 1910b of the second N+ polysilicon region 1910 as shown in FIG. 20. Hereafter, the bottom portion 1910b is referred to as the second N+ polysilicon region 1910b. In one embodiment, a top surface 1911 of the second N+ polysilicon region 1910b is at a lower level than a top surface 115 of the semiconductor substrate 110, as shown in FIG. 20.

Figure 21:
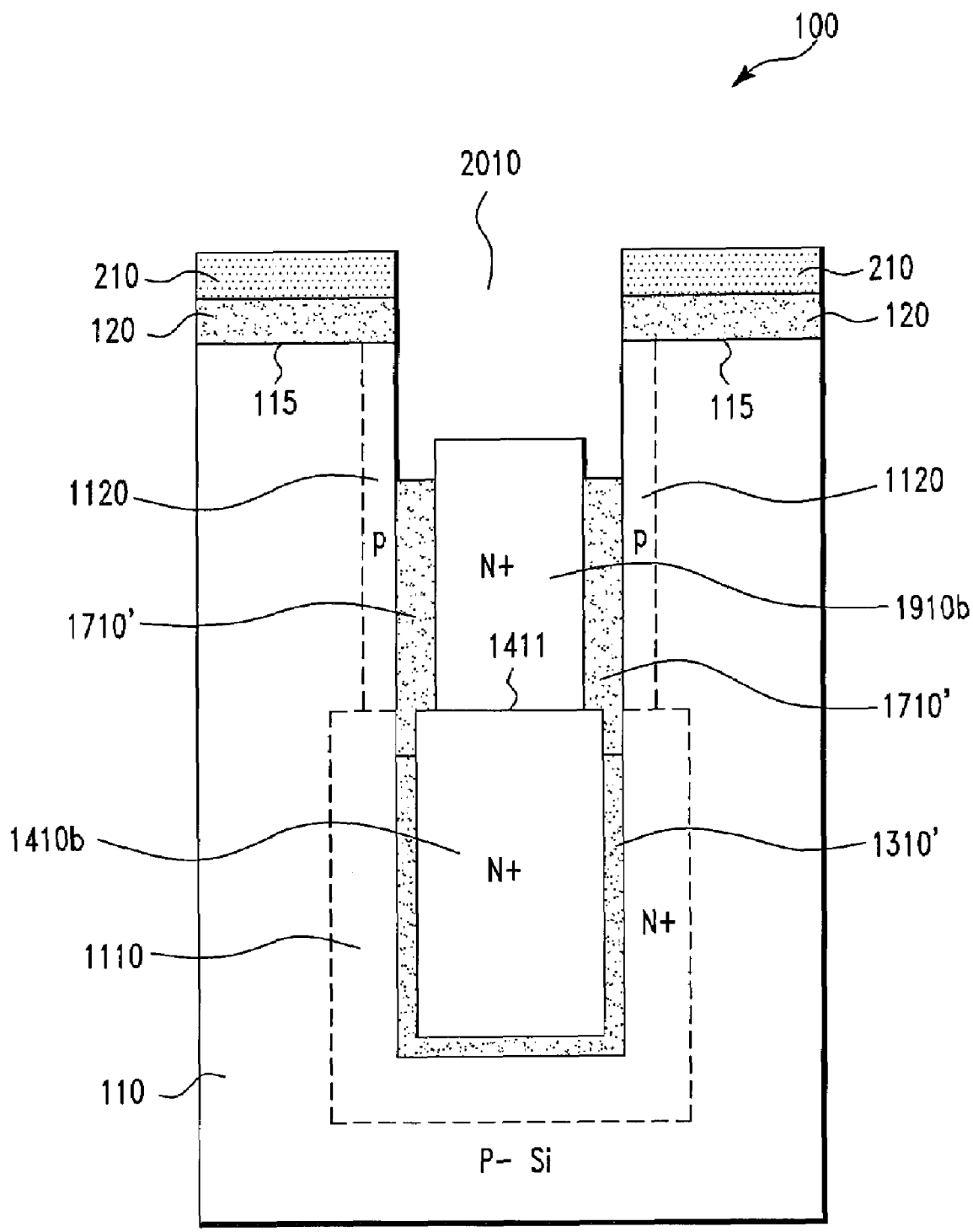

Next, with reference to FIG. 20, in one embodiment, the exposed portion of the collar layer 1710 is removed by, illustratively, wet etching, resulting in a collar layer 1710' and resulting in a trench 2010 as shown in FIG. 21.

Figure 22:
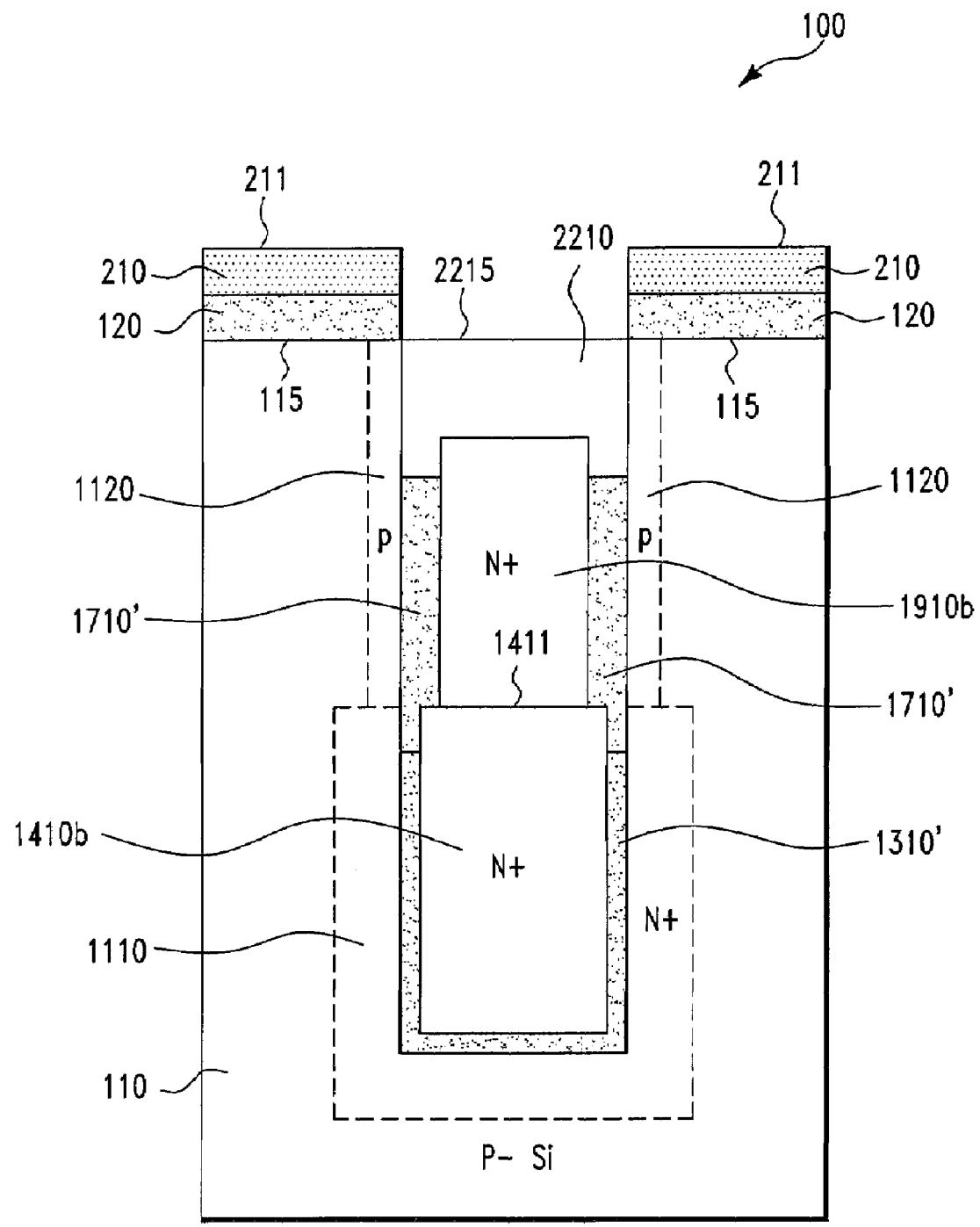

Next, with reference to FIG. 22, in one embodiment, a third conducting material (e.g., N+ polysilicon) region 2210 is formed in the trench 2010 of FIG. 21. Illustratively, the third N+ polysilicon region 2210 is formed by (i) CVD of a polysilicon layer (not shown) everywhere on top of the structure 100 (including the trench 2010) of FIG. 21, (ii) optional planarization of the deposited polysilicon layer, e.g., by CMP, until the top surface 213 of the pad nitride layer 210 is exposed to the surrounding ambient; and then (iii) recess of the third N+ polysilicon region 2210 so that a top surface 2215 of the third N+ polysilicon region 2210 is at a same level with the top surface 115 of the semiconductor substrate 110.

Figure 23:
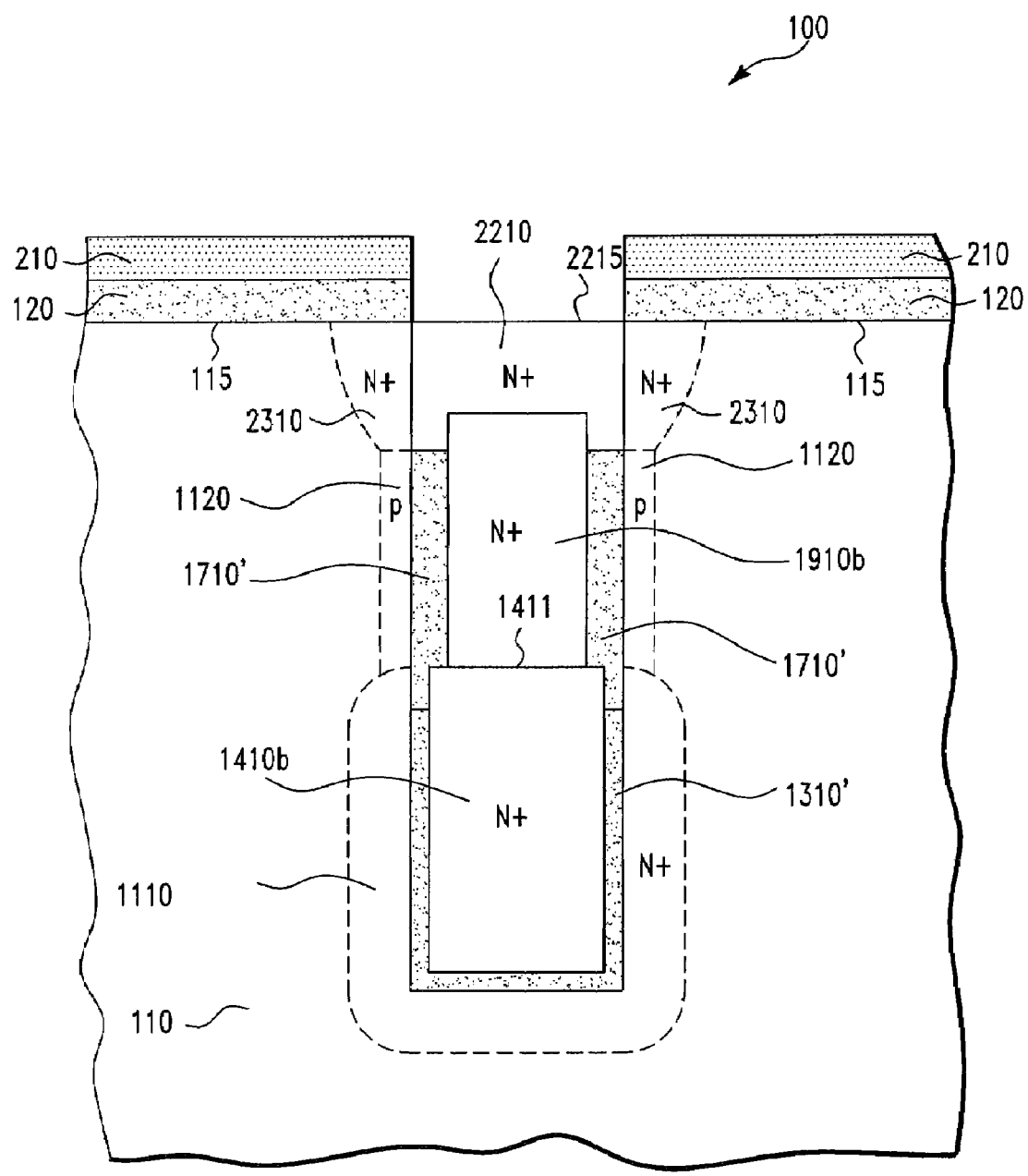

Next, in one embodiment, dopants of the third N+ polysilicon region 2210 diffuse into the semiconductor substrate 110 at subsequent high temperature (e.g., 700-1100° C.) processes, resulting in a buried strap region 2310 as shown in FIG. 23.

Figure 24:
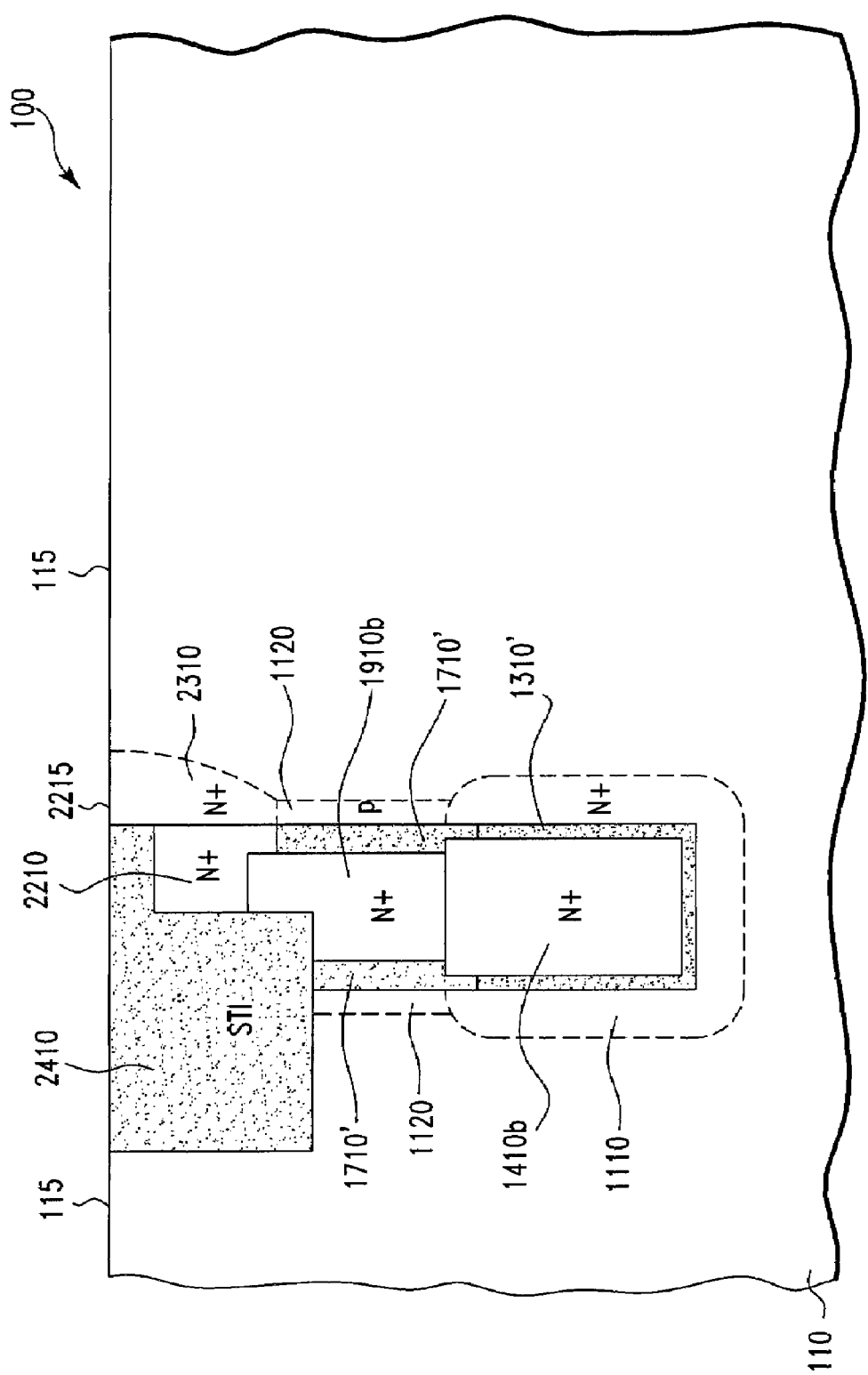

Next, with reference to FIG. 24, in one embodiment, an STI (shallow trench isolation) region 2410 is formed by conventional processes well known in the art. The pad nitride layer 210 and pad oxide layer 120 are removed before or after STI formation.

Figure 25:
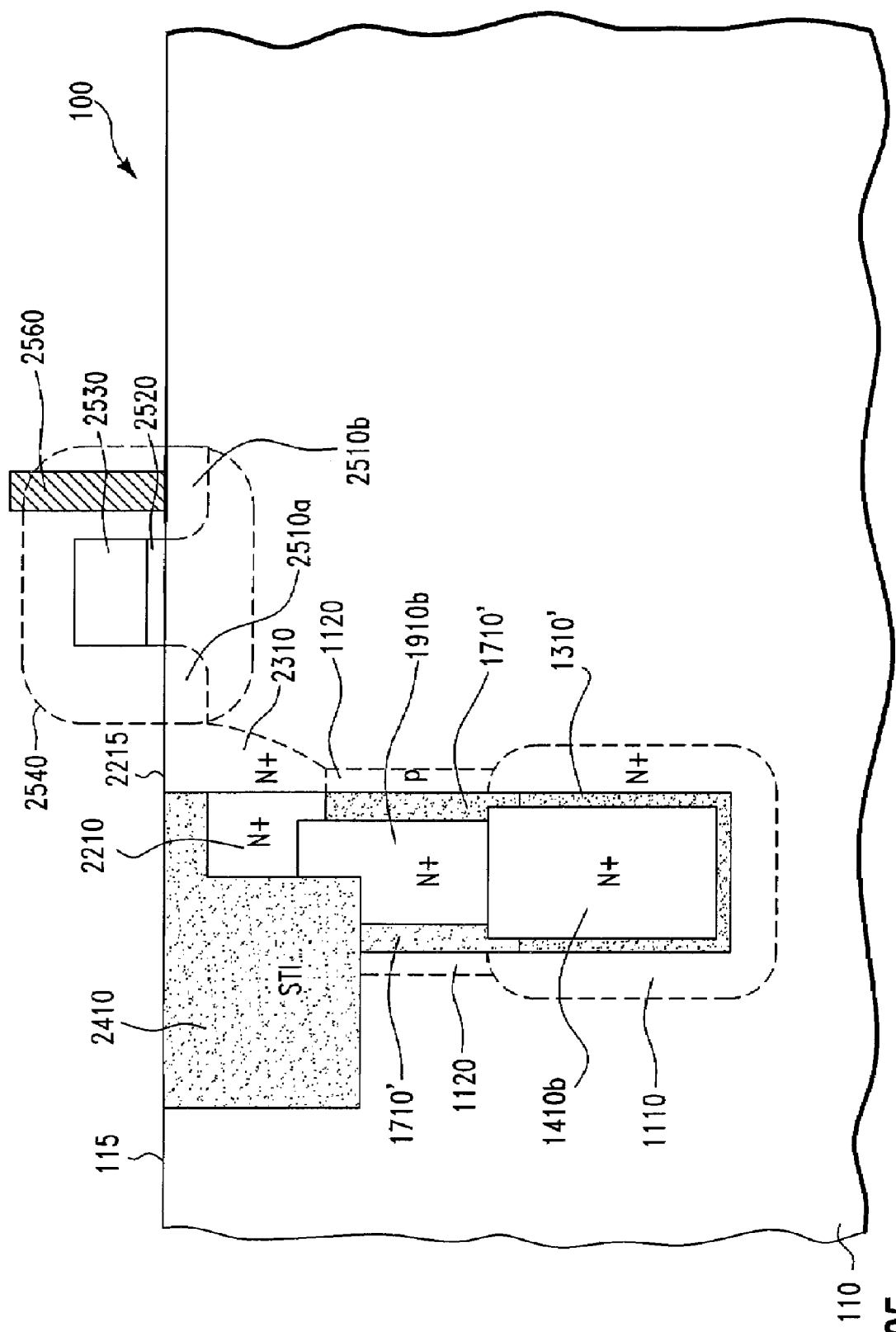

Next, with reference to FIG. 25, in one embodiment, a gate dielectric layer 2520, a gate electrode 2530, a first source/drain region 2510a, its associated contact region 2560, and a second source/drain region 2510b of an access transistor 2540 are formed by a conventional method, resulting in a DRAM cell which comprises a capacitor and the access transistor 2540. It should be noted that the capacitor comprises a capacitor dielectric layer 1310', a first capacitor electrode 1110 (which is the N+ buried plate 1110), a second capacitor electrode 1410*b*+1910*b*+2210 (which comprises the first N+ polysilicon region 1410*b*, the second N+ polysilicon region 1910*b*, and the third N+ polysilicon region 2210), and the buried strap region 2310 used to electrically connect the second capacitor electrode 1410*b*+1910*b*+2210 of the capacitor to the first source/drain region 2510*a* of the access transistor 2540.

It should be noted that there is an unwanted VPT (Vertical Parasitic Transistor) comprising a substrate, a gate electrode, a gate dielectric layer, a channel region, a first source/drain region and a second source/drain region. More specifically, the substrate of the VPT is the semiconductor substrate 110, the gate electrode of the VPT is the second N+ polysilicon region 1910*b*, the gate dielectric layer of the VPT is the collar layer 1710', the channel region of the VPT is the gradient P-well 1120, the first source/drain region of the VPT is the N+ buried plate 1110, and the second source/drain region of the VPT is the buried strap region 2310.

It should be noted that doping concentration of the P-well 1120 is gradient, meaning that when going from the collar layer 1710' outward, the doping concentration of the gradient P-well 1120 decreases. It should also be noted that the P-well is self-aligned to the buried plate 1110. The formation of the gradient P-well 1120 (the channel region of the VPT), which has the highest doping concentration next to the collar layer 1710', effectively raises the threshold voltage of the VPT. The gradient P-well by this invention reduces the leakage current flowing through the VPT without significantly increasing junction current leakage through the junction between the N+ buried plate 1110 and the gradient P-well 1120.

FIGS. 26-30 show a second fabrication process for forming a DRAM cell structure 200, in accordance with embodiments of the present invention.

Figure 26:
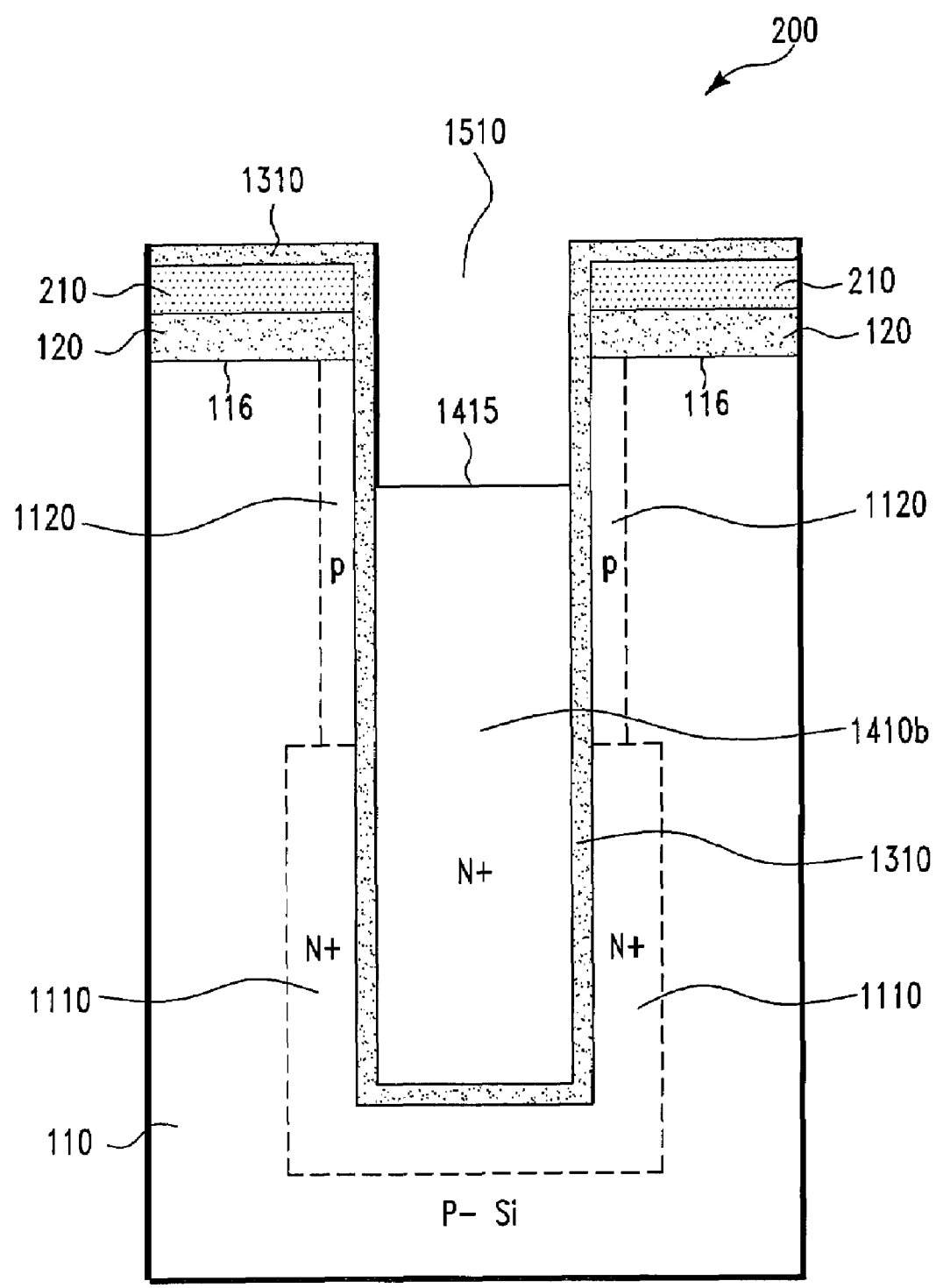
FIGS. 26-30 show a second fabrication process of another DRAM cell with a self-aligned gradient P-well, in accordance with embodiments of the present invention.

With reference to FIG. 26, in one embodiment, the second fabrication process starts out with a structure 200. Illustratively, the fabrication of the structure 200 of FIG. 26 is similar to the fabrication of the structure 100 of FIG. 15. Preferably, the gradient P-well 1120 has a greater doping concentration in this embodiment than the first embodiment. Illustratively, the doping concentration in the gradient P-well 1120 is preferably ranges from $5 \times 10^{17}/cm^3$ to $10^{19}/cm^3$ and more preferably ranges from $10^{18}$ to $5 \times 10^{18}/cm^3$.

Figure 27:
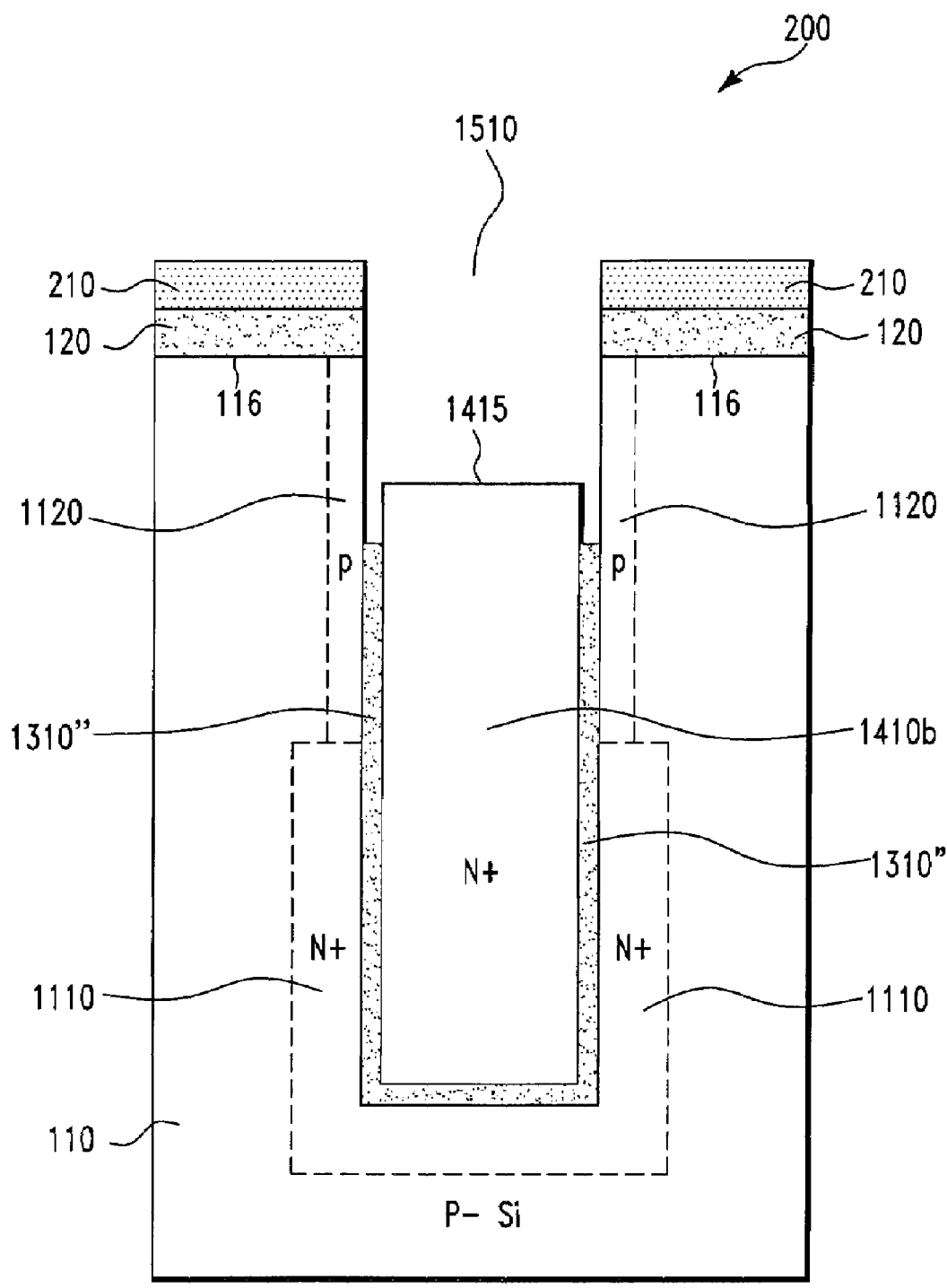

Next, in one embodiment, the exposed portion of the capacitor dielectric layer 1310 is removed by, illustratively, wet etching, resulting in the capacitor dielectric layer 1310" as shown in FIG. 27.

Figure 28:
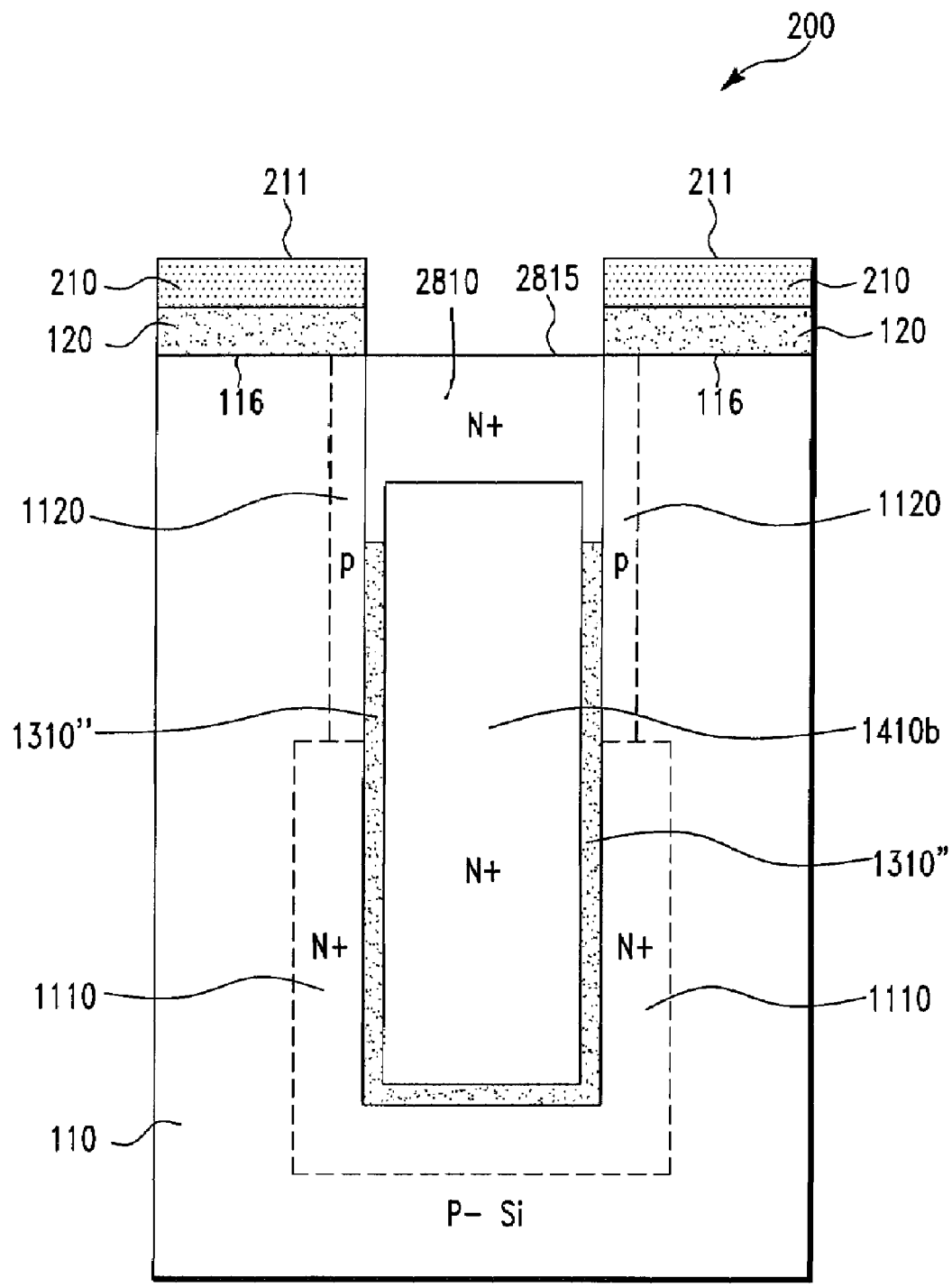

Next, with reference to FIG. 28, in one embodiment, a second N+ polysilicon region 2810 is formed in the trench 1510 of FIG. 27. Illustratively, the second N+ polysilicon region 2810 is formed by (i) CVD of a polysilicon layer (not shown) everywhere on top of the structure 200 (including in the trench 2610) of FIG. 27, and then (ii) optional planarization of the deposited polysilicon layer, e.g., by CMP, until the top surface 211 of the pad nitride layer 210 is exposed to the surrounding ambient and then (iii) recess of the second N+ polysilicon region 2810 so that a top surface 2815 of the second N+ polysilicon region 2810 is at a same level with the top surface 115 of the semiconductor substrate 110.

Figure 29:
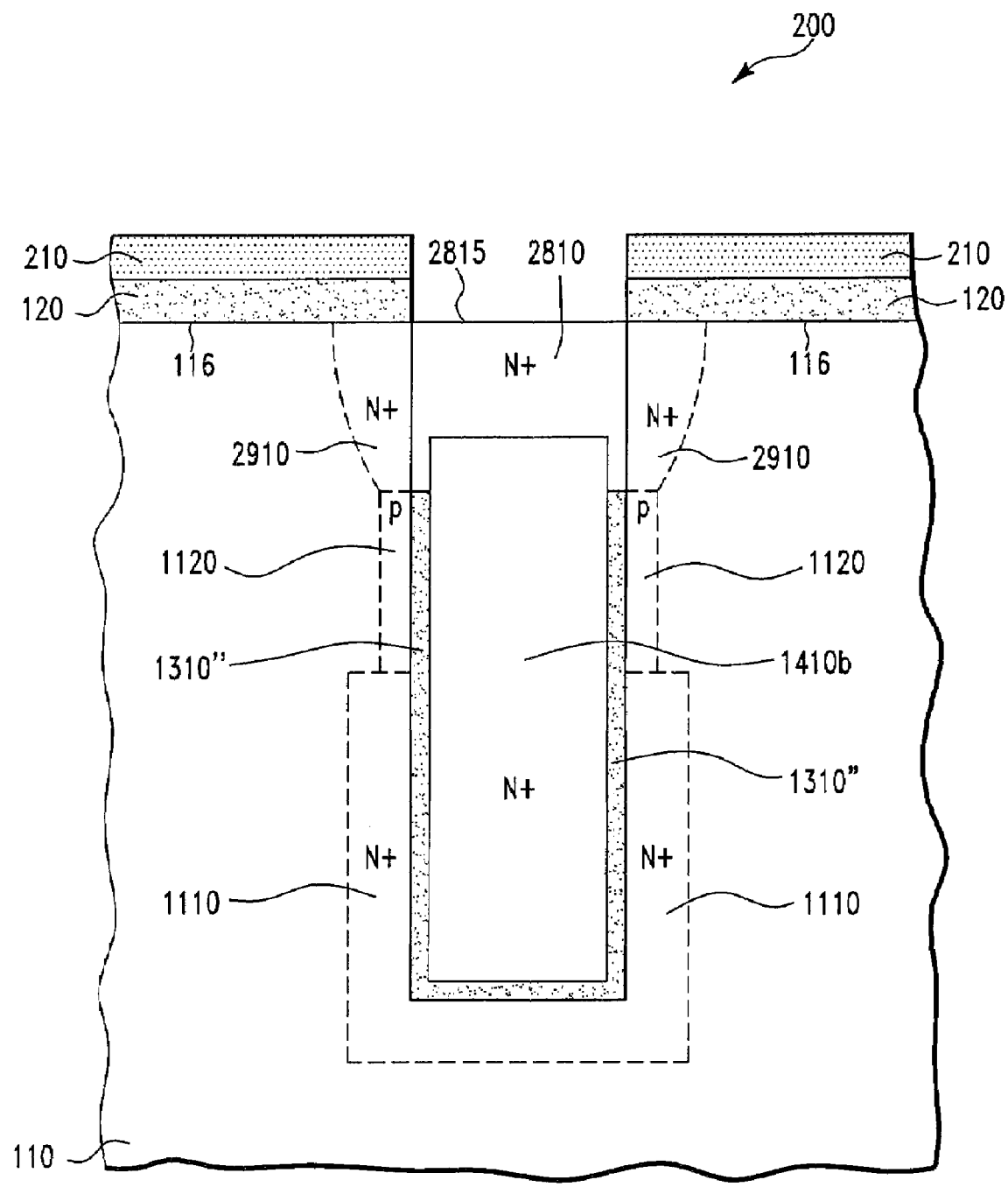

Next, in one embodiment, dopants of the second N+ polysilicon region 2810 diffuse into the semiconductor substrate 110 in the subsequent high temperature (e.g., 700-1100° C.) process, resulting in a buried strap region 2910 as shown in FIG. 29.

Figure 30:
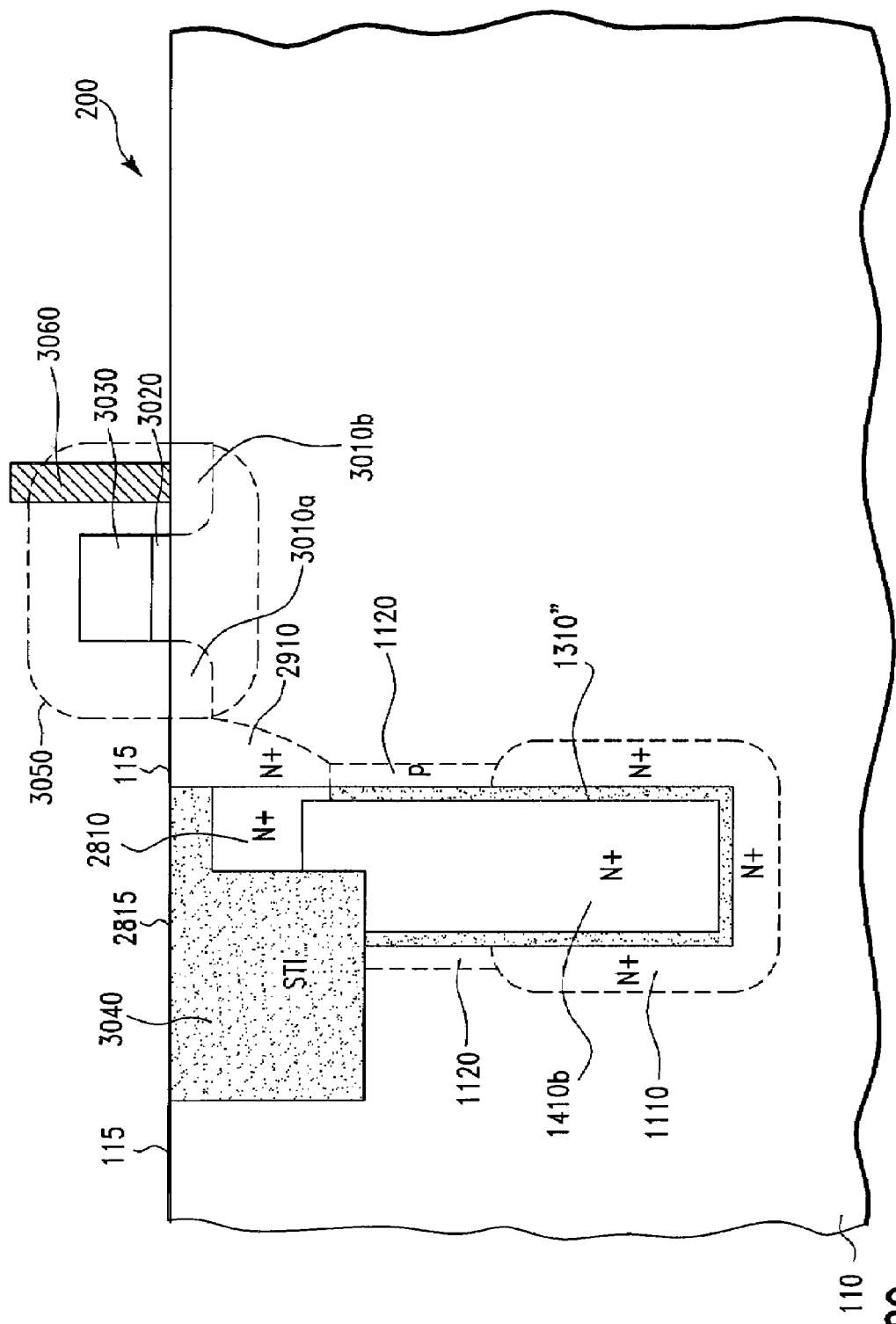

Next, with reference to FIG. 30, in one embodiment, an STI region 3040 is formed in the semiconductor substrate 110 by conventional processes well known in the art. The pad nitride layer 210 and pad oxide layer 120 are removed after STI formation.

Next, in one embodiment, a gate dielectric layer 3020, a gate electrode 3030, a first source/drain region 3010*a*, its associated contact region 3060, and a second source/drain region 3010*b* of an access transistor 3050 are formed by a conventional method, resulting in a DRAM cell which comprises a capacitor and the access transistor 3050. It should be noted that the capacitor comprises a capacitor dielectric layer 1310", a first capacitor electrode 1110 (which is the N+ buried plate 1110), a second capacitor electrode 1410*b*+2810 (which comprises the first N+ polysilicon region 1410*b*, and the second N+ polysilicon region 2810), and the buried strap region 2910 used to electrically connect the second capacitor electrode 1410*b*+2810 of the capacitor to the first source/drain region 3010*a* of the access transistor 3050.

Because of the gradient P-well 1120 which has the highest doping concentration next to the capacitor dielectric layer 1310" and therefore effectively increases the threshold voltage of the VPT, the leakage current flowing through the VPT is significantly reduced without significantly increasing the junction leakage current. Furthermore, since the P-well 1120 in FIG. 30 has a greater doping concentration than the P-well in the first embodiment, the threshold voltage of the VPT is further increased. Consequently, a collar layer like the collar layer 1710' in FIG. 25 (of the first fabrication process) can be eliminated. Besides, increasing too much the collar layer thickness is not applicable to trench technology with small ground-rules because the collar layer thickness is limited by the trench dimension.

In the embodiments described above, the doping polarities of the N+ buried plate 1110, the first N+ polysilicon region 1410*b*, the second N+ polysilicon region 1910*b*, the third N+ polysilicon region 2210, the buried strap region 2310, the first and second source/drain region 2510*a*, 2510*b*, the second N+ polysilicon region 2810, the buried strap region 2910, and the first and second source/drain region 3010*a*, 3010*b* are N type whereas the doping polarity of the gradient P-well 1120 is P type. Alternatively, the doping polarities of the buried plate 1110, the first polysilicon region 1410*b*, the second polysilicon region 1910*b*, the third polysilicon region 2210, the buried strap region 2310, the first and second source/drain region 2510*a*, 2510*b*, the second polysilicon region 2810, the buried strap region 2910, and the first and second source/drain region 3010*a*, 3010*b* can be P type whereas the doping polarity of the gradient well 1120 can be N type.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A semiconductor fabrication method, comprising:
    providing a semiconductor structure which includes:
        (a) a semiconductor substrate,
        (b) a trench in the semiconductor substrate,
        wherein the trench comprises a side wall and a bottom wall, and
        wherein the side wall comprises an upper side wall portion and a lower side wall portion;
    forming a first doped semiconductor region and a second doped semiconductor region, wherein the first doped semiconductor region (i) wraps around the lower side wall portion of the trench and (ii) abuts the bottom wall and the lower side wall portion of the trench, wherein the second doped semiconductor region wraps around and abuts the upper side wall portion of the trench, wherein the second doped semiconductor region is self-aligned to the first doped semiconductor region, wherein the first doped semiconductor region comprises dopants electrically exhibiting a first doping polarity, wherein the second doped semiconductor region comprises dopants electrically exhibiting a second doping polarity which is opposite to the first doping polarity, and after said forming the first doped semiconductor region and the second doped semiconductor region is performed, forming a dielectric layer and an electrically conducting region in the trench, wherein the dielectric layer is on the side wall and the bottom wall of the trench, wherein the dielectric layer comprises a capacitor dielectric portion and a collar dielectric portion, wherein the electrically conducting region comprises dopants of the first doping polarity, wherein the electrically conducting region comprises a first portion, a second portion, and a third portion, wherein the second portion is on top of and electrically coupled to the first portion, and the third portion is on top of and electrically coupled to the second portion, and wherein when going from an interfacing surface of the collar dielectric portion and the second doped semiconductor region and away from the collar dielectric portion, a doping concentration of the second doped semiconductor region decreases.

2. The method of claim 1, wherein a thickness of the capacitor dielectric portion is essentially the same as or less than a thickness of the collar dielectric portion.

3. The method of claim 1, wherein the collar dielectric layer is formed by thermal oxidation and wherein the collar dielectric layer essentially does not contain dopants.

4. The method of claim 1, wherein said forming the electrically conducting region comprises:
forming the first portion of the electrically conducting region in the trench;
forming the second portion of the electrically conducting region on top of and electrically coupled to the first portion and in the trench; and
forming the third portion of the electrically conducting region on top of the second portion and in the trench.

5. The method of claim 1, wherein the collar dielectric portion is sandwiched between and electrically insulates the second doped semiconductor region and the second portion of the electrically conducting region.

6. The method of claim 1, wherein said forming the first doped semiconductor region and the second doped semiconductor region comprises:

forming a first doping source region on the lower side wall portion and the bottom wall of the trench, wherein the first doping source region comprises dopants of the first doping polarity;

after said forming the first doping source region is performed, forming a second doping source region on the upper side wall portion of the trench, wherein the second doping source region comprises dopants of the second doping polarity which is opposite to the first doping polarity; and after said forming the second doping source region is performed, annealing the semiconductor structure to diffuse dopants simultaneously from the first and second doping source regions into the semiconductor substrate, resulting in the first doped semiconductor region and the second doped semiconductor region, respectively.

7. The method of claim 6,
wherein the first doping source region comprises arsenic silicate glass (ASG), and
wherein the second doping source region comprises boron silicate glass (BSG).

8. The method of claim 7,
wherein a doping concentration in the first doping source region is greater than a doping concentration in the second doping source region.

9. The method of claim 7, wherein said first and second doping source regions are removed after said annealing the semiconductor structure is performed.

10. The method of claim 1, wherein said forming the dielectric layer and the electrically conducting region comprises:
forming the capacitor dielectric portion on the lower side wall portion and the bottom wall of the trench; then
forming a first portion of the electrically conducting region in the trench; then
forming the collar dielectric portion on the upper side wall portion of the trench; then
forming the second portion of the electrically conducting region on top of and electrically coupled to the first portion and in the trench, wherein the collar dielectric portion is sandwiched between the second portion of the electrically conducting region and the second doped semiconductor region; and then
forming the third portion of the electrically conducting region on top of the second portion and in the trench.

11. The method of claim 10, further comprising forming a buried strap region,
wherein the buried strap region is in direct physical contact with both the third portion of the electrically conducting region and the second doped semiconductor region, and
wherein the buried strap region comprises dopants having the first doping polarity.

* * * * *